US012772763B2

(12) United States Patent
Yoshimoto et al.

(10) Patent No.: US 12,772,763 B2

(45) Date of Patent: Oct. 20, 2026

(54) DEPOSITION OF FLOWABLE SiCN FILMS BY PLASMA ENHANCED ATOMIC LAYER DEPOSITION

(71) Applicant: ASM IP HOLDING B.V., Almere (NL)

(72) Inventors: Shinya Yoshimoto, Tama (JP); Jhoelle Roche Guhit, Tama (JP); Makoto Igarashi, Fuchu (JP); Hideaki Fukuda, Hachioji (JP); Aurelie Kuroda, Chofu (JP); Timothee Blanquart, Oud-Heverlee (BE); Takahiro Onuma, Chofu (JP)

(73) Assignee: ASM IP Holding B.V., Almere (NL)

( * ) Notice: Subject to any disclaimer, the term of this patent is extended or adjusted under 35 U.S.C. 154(b) by 628 days.

(21) Appl. No.: 18/300,301

(22) Filed: Apr. 13, 2023

(65) Prior Publication Data

US 2023/0335392 A1 Oct. 19, 2023

Related U.S. Application Data

(60) Provisional application No. 63/363,173, filed on Apr. 18, 2022.

(51) Int. Cl.

| | |
|---|---|
| ***H10P 14/69*** | (2026.01) |
| ***C23C 16/36*** | (2006.01) |
| ***C23C 16/455*** | (2006.01) |
| ***C23C 16/48*** | (2006.01) |
| ***C23C 16/52*** | (2006.01) |
| ***H10P 14/60*** | (2026.01) |

(52) U.S. Cl.

CPC .......... *H10P 14/6905* (2026.01); *C23C 16/36* (2013.01); *C23C 16/4554* (2013.01); *C23C 16/482* (2013.01); *C23C 16/52* (2013.01); *H10P 14/6339* (2026.01); *H10P 14/6532* (2026.01); *H10P 14/6538* (2026.01); *H10P 14/6689* (2026.01)

(58) Field of Classification Search

CPC ... C23C 16/52; C23C 16/482; C23C 16/4554; C23C 16/36

See application file for complete search history.

(56) References Cited

U.S. PATENT DOCUMENTS

| | | | | |
|---|---|---|---|---|
| 10,204,790 | B2 | 2/2019 | Kawahara et al. | |
| 2015/0118862 | A1* | 4/2015 | Reilly | H10P 14/6334 438/778 |
| 2016/0314964 | A1* | 10/2016 | Tang | H10P 14/6336 |
| 2017/0029947 | A1* | 2/2017 | Kawahara | C23C 16/45527 |

(Continued)

FOREIGN PATENT DOCUMENTS

WO 2017019250 A1 2/2017

*Primary Examiner* — Kelly M Gambetta

(74) *Attorney, Agent, or Firm* — Snell & Wilmer L.L.P.

(57) ABSTRACT

In accordance with some embodiments herein, methods and apparatuses for flowable deposition of thin films are described. Some embodiments relate to cyclical processors for gap-fill in which deposition is followed by a thermal anneal and ultraviolet treatment and repeated. In some embodiments, the deposition, thermal anneal, and ultraviolet treatment are carried out in separate stations. In some embodiments, a second station is heated to a higher temperature than a first station. In some embodiments, a separate module is used for curing.

21 Claims, 28 Drawing Sheets

(56) References Cited

U.S. PATENT DOCUMENTS

| | | | |
|---|---|---|---|
| 2017/0114465 A1 | 4/2017 | Kalutarage et al. | |
| 2018/0330980 A1* | 11/2018 | Liang | C23C 16/045 |
| 2022/0119944 A1 | 4/2022 | Yoshimoto et al. | |

* cited by examiner

ALD/CVD Deposition

Flowable Deposition

Flowable Deposition & Post Anneal

Flowable Deposition & Cyclic Anneal/UV

| | Cyclic UV 3min | Cyclic UV 10min |
|---|---|---|
| Depo | 20s x3 | 7s x7 |
| UV | 3 min, 100C | 10 min, 100C |
| Plasma cure | $HeH_2$ 500W 300Pa | $HeH_2$ 500W 300Pa |
| STEM<br>CD 25nm |  |  |
| Surface WERR | 0.0 | 0.0 |
| Shrink[%]<br>400C 30min | 0.0 | 0.0 |

DEPOSITION OF FLOWABLE SiCN FILMS BY PLASMA ENHANCED ATOMIC LAYER DEPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of U.S. Provisional Application No. 63/363,173, filed Apr. 18, 2022, the contents of which are hereby incorporated by reference in their entirety.

BACKGROUND

Field

The embodiments herein are generally related to methods and apparatuses for semiconductor manufacturing.

Description of Related Art

Integrated circuits are typically manufactured by complex, multi-step processes in which various layers of materials are sequentially constructed in a predetermined arrangement on a substrate. Thus, earlier processing steps can have significant impacts on later steps, and the effects of deviations from expected parameters (e.g., thickness, density, uniformity) can compound. Accordingly, it is important that layers be of high quality. For example, voids, thickness non-uniformity, and other defects in a layer can cause significant problems and can reduce device yield.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

Some embodiments herein are directed to a method for flowable gap-fill deposition, the method comprising: (a) placing a substrate in a first station; (b) depositing a flowable material on the substrate in the first station by a vapor deposition process at a first temperature; (c) placing the substrate in a second station; (d) performing a thermal and ultraviolet treatment on the substrate by heating a surface of the substrate to a second temperature in the second station and exposing the substrate to ultraviolet light; and repeating (a)-(d) in a cycle until a film of desired thickness is deposited on the substrate.

In some embodiments, the flowable material is formed by a silylamine precursor. In some embodiments, the precursor is hexamethyldisilazane. In some embodiments, the precursor is 1,1,3,3-tetramethyl-1,3-divinyldisilazane. In some embodiments, the precursor is 1,1,3,3-Tetramethyldisilizane.

In some embodiments, the first temperature is less than 300° C. In some embodiments, the second temperature is between 80° C. and 1000° C. In some embodiments, a rapid thermal anneal may not be necessary and the second temperature may be between 80° C. and 700° C. In some embodiments, the ultraviolet light has a wavelength between 100 nm and 230 nm. In some embodiments, the ultraviolet light is provided by an excimer lamp. In some embodiments, the ultraviolet light is provided by an excimer lamp. In some embodiments, an excimer molecule is one of NeF, Ar2, Kr2, F2, ArBr, Xe2, ArCl, KrI, ArF, KrBr, or KrCl. In some embodiments, a low pressure mercury lamp may be used and may deliver light across a wide range of wavelengths. In some embodiments, a low pressure mercury lamp may result in significant greater heating of the film than an excimer lamp. Thus, in some embodiments, a susceptor temperature may be adjusted based on the type of lamp used for UV curing.

In some embodiments, the first station comprises an upper chamber and a lower chamber, and wherein the lower chamber comprises a shared intermediate space between the first station and the second station. In some embodiments, the first station and the section station comprise a shared pressure system such that the first station and the second station are maintained at a common pressure during the cycle.

In some embodiments, the common pressure during the cycle is between 300 Pa and 2800 Pa. In some embodiments, the first station comprises a first station heating unit configured to control a temperature of the first station independently of a temperature of the second station, and wherein the second station comprises a second station heating unit configured to control the temperature of the second station independently of the first station.

In some embodiments, the film comprises a SiCN film. In some embodiments, the film fills at least 90% of a gap on the surface of the substrate, at least 95% of a gap on the surface of the substrate, at least 99% of a gap on the surface of the substrate, or at least 99.5% of a gap on the surface of the substrate. In some embodiments, the substrate comprises silicon or germanium.

In some embodiments, the method further comprises introducing one or more process gasses into the first station during contacting the substrate in the first station, wherein the process gases comprise Ar, He, $N_2$, $H_2$, $NH_3$, $O_2$, or a combination of one or more of the above.

In some embodiments, the method further comprises plasma curing the substrate after step (b) or (d), wherein the plasma curing comprises micro-pulsing radio frequency plasma into the first station or the second station. In some embodiments, the substrate is plasma cured in the second station after the thermal and ultraviolet treatment is performed on the substrate.

In some embodiments, the method further comprises, after a film of desired thickness is deposited on the substrate: transferring the substrate to an annealing chamber; and annealing the substrate at a third temperature, wherein the third temperature is higher than the first temperature and the second temperature.

In some embodiments, the thermal and ultraviolet treatment is performed for every 1 nm to 5 nm of deposited film thickness or for every 5 nm to 100 nm of deposited film thickness. In some embodiments, a UV treatment may cure up to about 100 nm from the surface. Accordingly, in some embodiments, a UV treatment may be performed for about every 100 nm of deposited film thickness or less. In some embodiments, the ultraviolet treatment comprises a vacuum ultraviolet (VUV) treatment.

Some embodiments herein are directed to a semiconductor processing apparatus comprising: one or more process chambers, each process chamber comprising two or more stations, each station comprising an upper compartment and a lower compartment, wherein the upper compartment is configured to contain a substrate during processing of the substrate, wherein the lower compartment comprises a shared intermediate space between the two or more stations; a first transfer system configured to move a substrate from a first process chamber to a second process chamber in a wafer handling chamber; a second transfer system configured to move the substrate from a first station to a second station within the shared intermediate space of a process chamber; a first heating unit configured to control a first station temperature independently of a second station temperature; a pressure system comprising a pump and exhaust, the pressure system configured to maintain a common process chamber pressure in the two or more stations; and a controller comprising a processor that provides instructions to the apparatus to control a cycle of: (a) placing a substrate in a first station; (b) depositing a flowable material on the substrate in the first station by a vapor deposition process at a first temperature, wherein the first temperature is less than 150° C.; (c) after depositing the flowable material on the substrate, placing the first substrate in the second station; (d) performing a thermal treatment and ultraviolet treatment on the substrate by heating a surface of the substrate to a second temperature in the second station and exposing the substrate to ultraviolet light; and repeating (a)-(d) in a cycle until a film of desired thickness is deposited on the substrate.

Some embodiments herein are directed to a method for flowable gap-fill deposition, the method comprising: (a) placing a substrate in a first station, the first station comprising an upper chamber and a lower chamber, wherein the lower chamber comprises a shared intermediate space between the first station, a second station, a third station, and a fourth station; (b) contacting the substrate in the first station with a precursor at a first temperature, wherein the contacting with the precursor forms a first flowable film layer within a gap of the first substrate; (c) after contacting the substrate in the first station with the precursor, placing the substrate in the second station; (d) performing a first thermal and ultraviolet treatment on the substrate by heating the substrate to a second temperature in the second station and exposing the substrate to ultraviolet light; (e) after performing the first thermal and ultraviolet treatment on the substrate, placing the substrate in the third station; (f) contacting the substrate in the third station with the precursor at the first temperature, wherein the contacting with the precursor forms a second flowable film layer within a gap of the first substrate; (g) after contacting the substrate in the third station with the precursor, placing the substrate in the fourth station; (h) performing a second thermal and ultraviolet treatment on the substrate by heating the substrate to the second temperature in the fourth station and exposing the substrate to ultraviolet light; and repeating (a)-(h) in a cycle until a film of desired thickness is deposited on the first substrate, wherein the second temperature is different from the first temperature.

BRIEF DESCRIPTION OF THE DRAWINGS

These and other features, aspects, and advantages of the disclosure are described with reference to drawings of certain embodiments, which are intended to illustrate, but not to limit, the present disclosure. It is to be understood that the accompanying drawings, which are incorporated in and constitute a part of this specification, are for the purpose of illustrating concepts disclosed herein and may not be to scale.

DETAILED DESCRIPTION

Figure 1A:
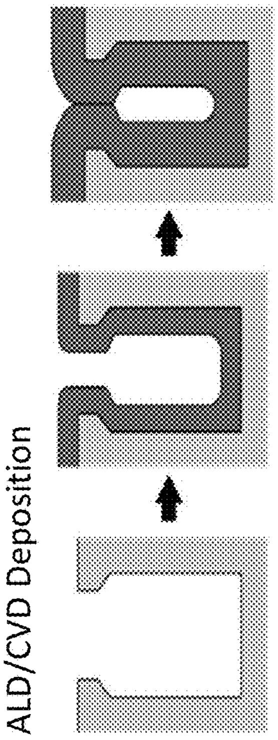
FIGS. 1A-1D illustrate several different types of gap-fill processes.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

As used herein, the term "substrate" may refer to any underlying material or materials, including any underlying material or materials that may be modified, and/or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide. A continuous substrate may extend beyond the bounds of a process chamber where a deposition process occurs. In some processes, the continuous substrate may move through the process chamber such that the process continues as the substrate moves, for example, until the end of the substrate is reached. A continuous substrate may be supplied from a continuous substrate feeding system to allow for manufacture and output of the continuous substrate in any appropriate form.

In semiconductor fabrication, it is often necessary to fill gaps in a substrate, for example with an insulating material. As device geometries shrink and as high aspect ratio features become common (e.g., tall features that are narrowly spaced apart), void-free filling of gaps can become increasingly difficult. The films typically deposited by existing flowable gap-fill processes have a variety of drawbacks. For example, they may exhibit poor quality and/or poor thermal stability. This may result in significant problems. For example, films may shrink by 40% or more after annealing at high temperatures (e.g., around 400° C.). Films may also etch at a rate that is higher than desired or that is unpredictable and/or unstable.

Many deposition processes have difficulty filling small trenches and other gap features used in current semiconductor processing schemes. Individual trenches and other gap-like features produced in any given technology node have principal dimensions that are significantly smaller than the critical dimensions that define the node. Thus, is common to find gaps on a nanometer scale. Furthermore, unless the processes are highly conformal, the gaps pinch off at their necks, which can lead to the formation of voids. Furthermore, many of these gaps have relatively high aspect ratios.

Figure 2A:
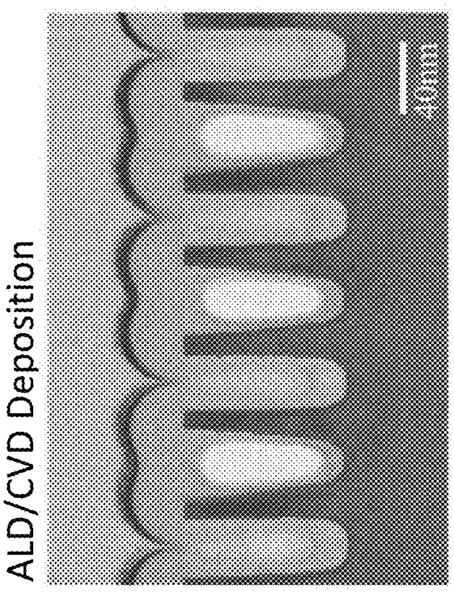
FIGS. 2A-2D illustrate microscopy images of example flowable SiCN films deposited using the gap fill processes illustrated in FIGS. 1A-1D.

Filling gaps with fill material while avoiding voids in the fill material is challenging. Recent minimization advances in semiconductor devices, such as Self-Aligned-Contact (SAC) gap-fill in middle end of line (MEOL or MOL) processes and dummy fin gap-fill/Gate All Around (GAA) lateral processes in front end of line (FEOL) processes, require that voids and seams in gap fills be minimized and preferably eliminated. Films should preferably be of high quality such that they exhibit a high degree of etching stability and show minimal post-thermal shrinkage. Conventional chemical vapor deposition (CVD) and atomic layer deposition (ALD) of layers such as SiCN films typically results in seams and/or voids inside the gap structure. Often, it is difficult to obtain a flowable SiN or SiCN film during deposition. For example, FIG. 1A illustrates an example using ALD or CVD deposition of a thin film. As illustrated, ALD or CVD deposition may result in the formation of one or more voids in the gap. FIG. 2A illustrates a scanning transmission electron microscope (STEM) image of an example flowable SiCN film formed using ALD or CVD deposition. As shown in FIG. 2A, the SiCN film exhibits multiple voids.

Figure 1B:
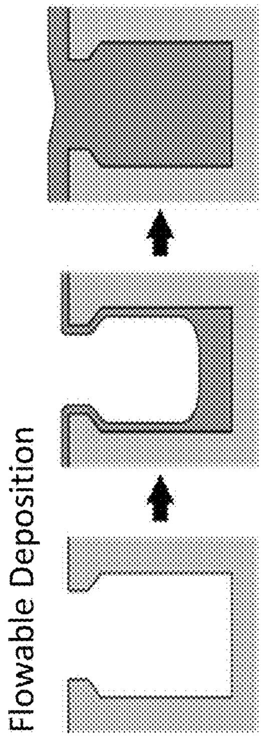
Figure 2B:
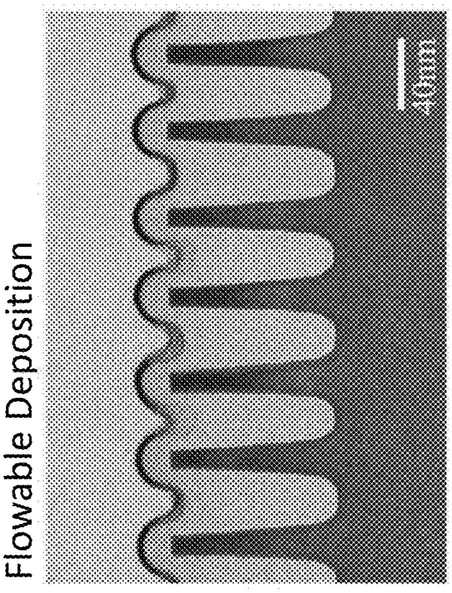

One way to reduce the formation of seams or voids in SiN or SiCN film deposition in a gap is to use flowable deposition with another element such as a carbon (e.g., methyl group) or hydrogen (e.g., amine group) added in a gap-fill precursor. This method may lead to a flowable SiCN or SiN deposition with substantially no seams/voids. FIGS. 1B and 2B illustrate example void-free gap fills using a flowable deposition with carbon or hydrogen augmented precursors. However, flowable deposition processes are often performed at low temperature (e.g., 150° C. or less) to maintain precursor flowability, resulting in a lower film quality. For example, the films typically deposited by flowable gap-fill exhibit high surface variability, poor quality and/or bad thermal stability. This can result in higher than desired wet etch rates and film shrinkage of 40% or more after annealing at increased temperatures (e.g., around 400° C.).

Figure 1C:
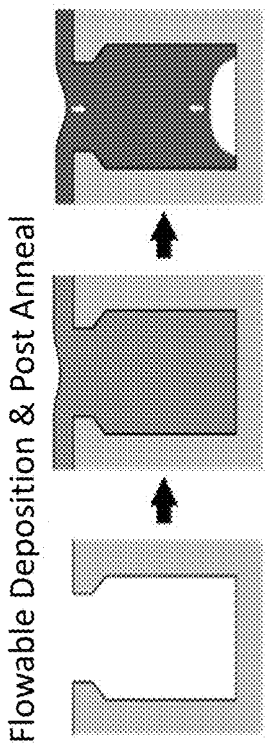
Figure 2C:
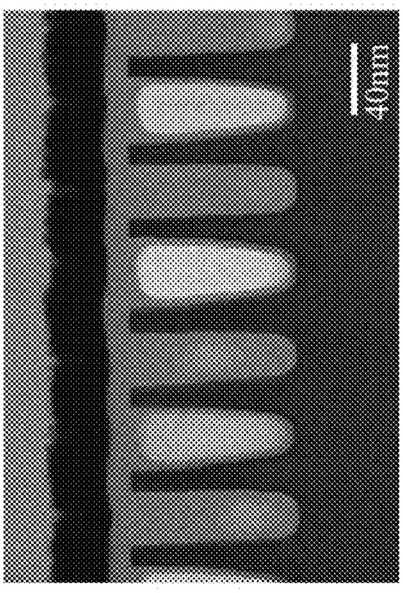

A post-deposition treatment may be used to achieve a high-quality flowable SiCN or SiN film. However, post-deposition treatment of wafers may lead to slower throughput. Furthermore, a single post-deposition treatment may provide limited reforming depth. For example, FIGS. 1C and 2C illustrate example flowable deposition gap-fills using a post-deposition anneal (i.e., thermal treatment). As illustrated in FIG. 1C and shown in the STEM image of FIG. 2C, a single post-deposition anneal may not form a completely void-free, and seam-free gap-fill. A single thermal treatment may result in a shrinkage of the film, which may lead to void formation at the bottom of the film, as shown in FIGS. 1C and 2C.

INTRODUCTION

In accordance with some embodiments herein, methods and apparatuses for flowable deposition of thin films are described. Methods and apparatuses described herein relate to filling gaps or other three-dimensional features on substrates, such as trenches, with a solid material by forming a flowing film in the gap. Some embodiments herein relate to a cyclic process including a deposition cycle comprising a flowable deposition and a treatment step that includes a thermal anneal and an ultraviolet (UV) cure. In some embodiments, the treatment step may include heating a substrate to an increased temperature relative to the deposition temperature. In some embodiments, the treatment step may be performed in a separate station than the deposition. In some embodiments, the treatment step may be performed by heating a susceptor or substrate stage to a higher temperature than that used in the flowable deposition. In some embodiments, the thermal anneal may comprise a rapid thermal anneal (RTA) with an infrared (IR) treatment. In some embodiments, the cycle may be carried out in a multi-process chamber comprising one or more stations connected by a shared intermediate space.

In some embodiments, a cyclic temperature and UV treatment can be used as part of the gap-fill deposition process. In some embodiments, the cyclic temperature and UV treatment may comprise performing gap-fill at low temperature followed by a cure at increased temperature and exposure to UV light. In some embodiments, the cyclic gap-fill deposition process comprising a deposition cycle including the thermal and UV treatment step may fill a gap without the formation of voids or seams or may reduce the formation of voids or seams relative to a process that does not use the cyclic treatment. In some embodiments, the cyclic temperature and UV treatment described herein may provide improved throughput relative to post-deposition treatment processes that require movement to different, separate reaction chamber. In some embodiments, the treatment of the growing film with an increased temperature and UV treatment in each deposition cycle results in improved films, for example films with fewer seams or voids relative to other processes. In some embodiments, the heat and UV treatment may improve cross-linking.

Some embodiments herein comprise using a multi-process chamber apparatus having one or more low-temperature deposition stations and one or more treatment stations. In some embodiments, a Multi-Process Quadruple-Chamber-Module (QCM) may be used, in which one or more low temperature deposition stations and one or more treatment (e.g., thermal annealing and/or UV treatment) stations are used. For example, some apparatuses may comprise two deposition stations and two treatment stations. In some embodiments, some apparatuses may comprise four treatment stations, which may be configured to heat substrates to different temperatures. In some embodiments, an a-CH, SiCN, SiN, SiON, SiCO, SiCOH, SiCNH, SICH, SINH, or SiCON gap fill may be utilized. Thus, although the embodiments herein a primarily described in relation to SiCN and/or SiN deposition, some embodiments herein may be broadly applicable to various process chemistries.

Figure 1D:
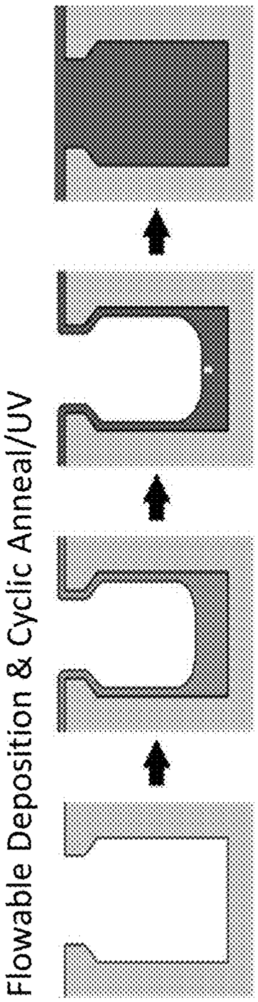
Figure 2D:
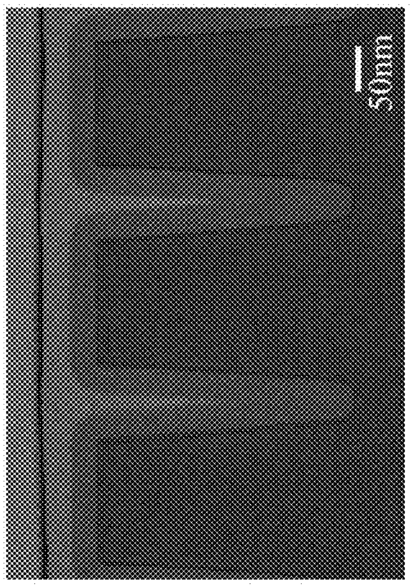
Figure 2E:
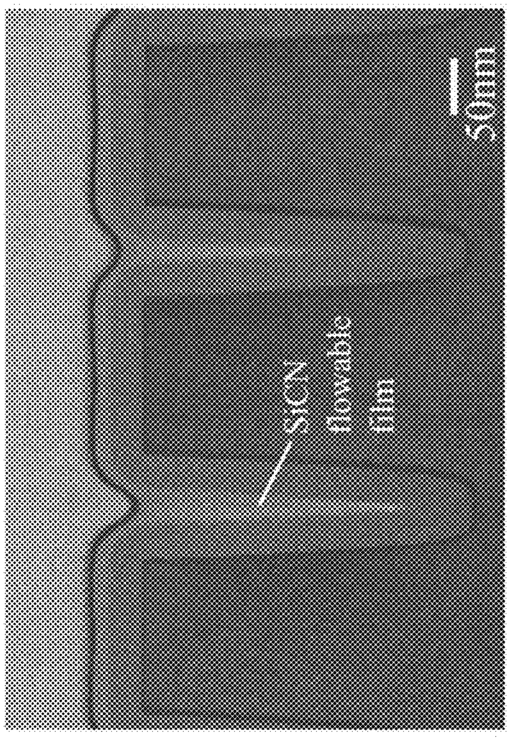
FIGS. 2E-2F illustrate microscopy images of example flowable SiCN films deposited according to some embodiments herein.
Figure 2F:
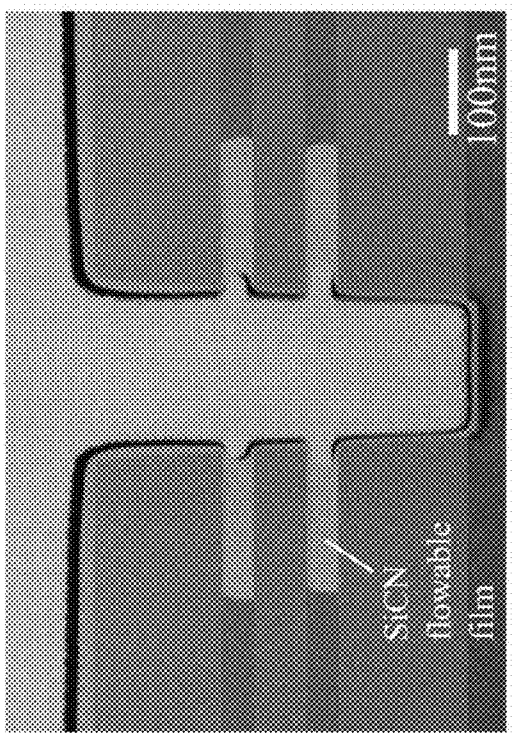

As noted above in relation to FIGS. 1C and 2C, a single post-deposition thermal treatment may be used to achieve a relatively high quality flowable SiCN or SiN film. However, as noted above, post-deposition treatment of wafers may lead to undesirable degradation of throughput. Furthermore, a single post-deposition treatment may not be adequate because of a limited reforming depth. Similarly, a single plasma treatment may improve film quality, but does not reach into the bulk region. Thus, a cyclic deposition process including thermal treatment (e.g., annealing) and UV treatment in each cycle can provide improved gap fill as illustrated in FIGS. 1D and 2D. In some embodiments, cyclic annealing and UV treatment may be very effective to prevent or limit film shrinkage. FIG. 1D illustrates an example flowable gap-fill using a cycling anneal and UV treatment. FIG. 2D illustrates a STEM image of a SiCN flowable gap-fill using a cyclic anneal and UV treatment. As illustrated in FIGS. 1D and 2D, a flowable gap-fill using a cyclic process comprising one or more cycles including a thermal and UV treatment phase may produce a high quality film with no or few voids or seams. In some embodiments, the cyclic process may be performed in a conventional reaction chamber apparatus. In some embodiments, the cyclic process may be performed in a QCM apparatus as discussed herein. In some embodiments, the thermal and ultraviolet treatments may occur simultaneously. In other embodiments, the thermal treatment may occur separately from the ultraviolet treatment, or the two may overlap and one may begin and/or end before the other. FIGS. 2E and 2F illustrate example SiCN flowable films made using a cyclic deposition and thermal and UV treatment.

Figure 2G:
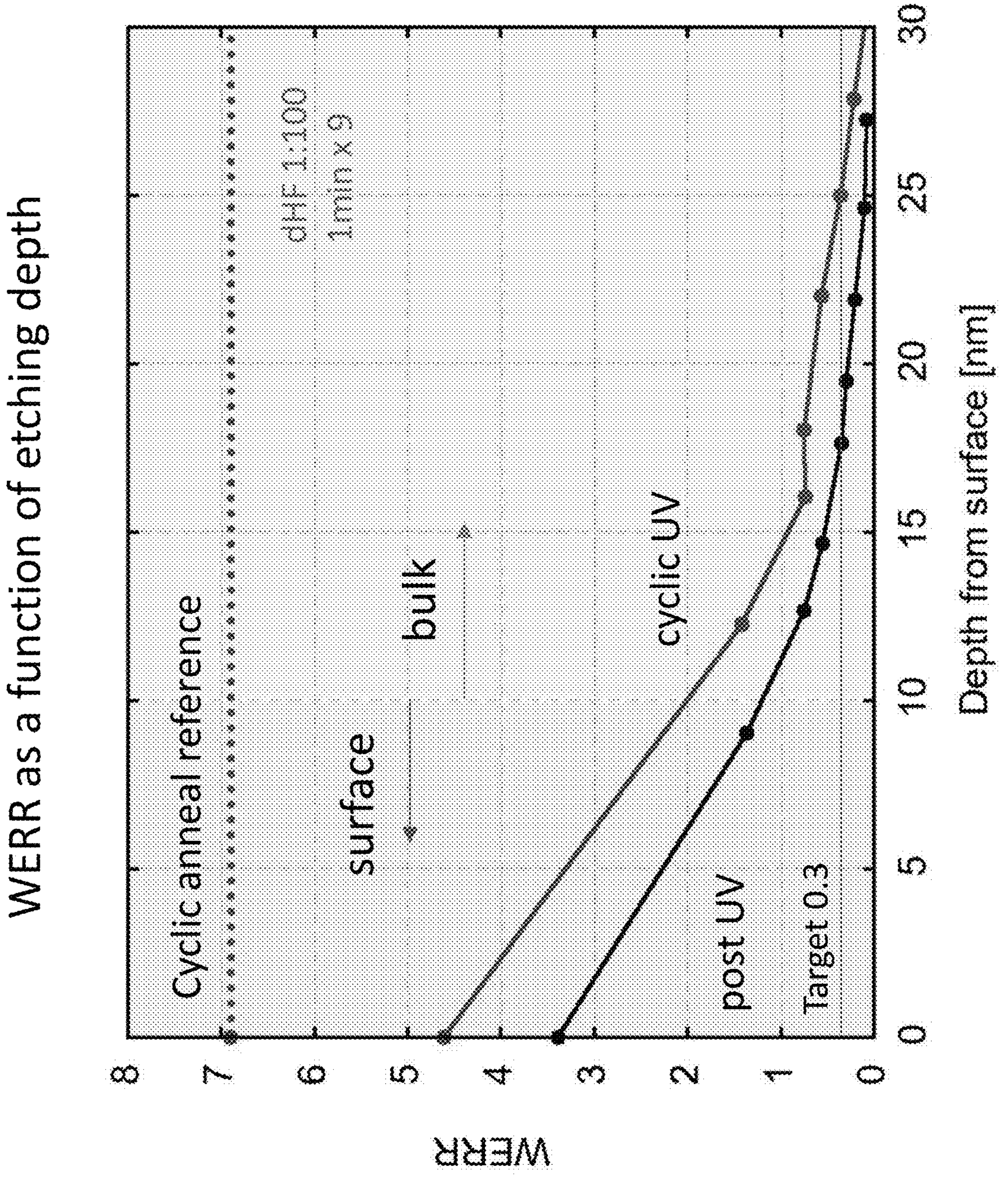
FIG. 2G illustrates wet etch rate ratios for films deposited using various methods.
Figure 2H:
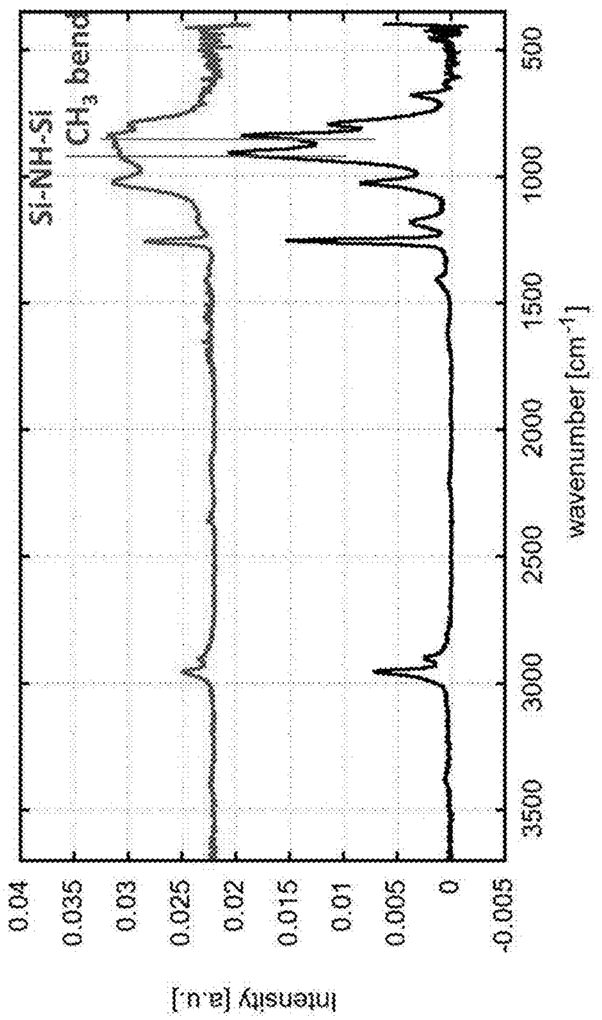
FIG. 2H illustrates a Fourier transform infrared spectroscopy (FTIR) for a film cured according to some embodiments herein.

FIG. 2G illustrates wet etch rate ratios (WERRs) for films deposited using various methods. Advantageously, cyclic treatment with ultraviolet (UV) light can decrease the wet etch rate ratio (WERR) compared with a cyclic anneal without UV treatment. FIG. 2H illustrates example Fourier Transform Infrared (FTIR) spectra showing Si—NH—Si and $CH_3$ bending vibrations for as-deposited and UV-cured and low-temperature annealed (at 100° C.) SiCN films formed using hexamethyldisilazane as the precursor. Changes in these vibrations after UV cure may indicate cross-linking formation.

Figure 3A:
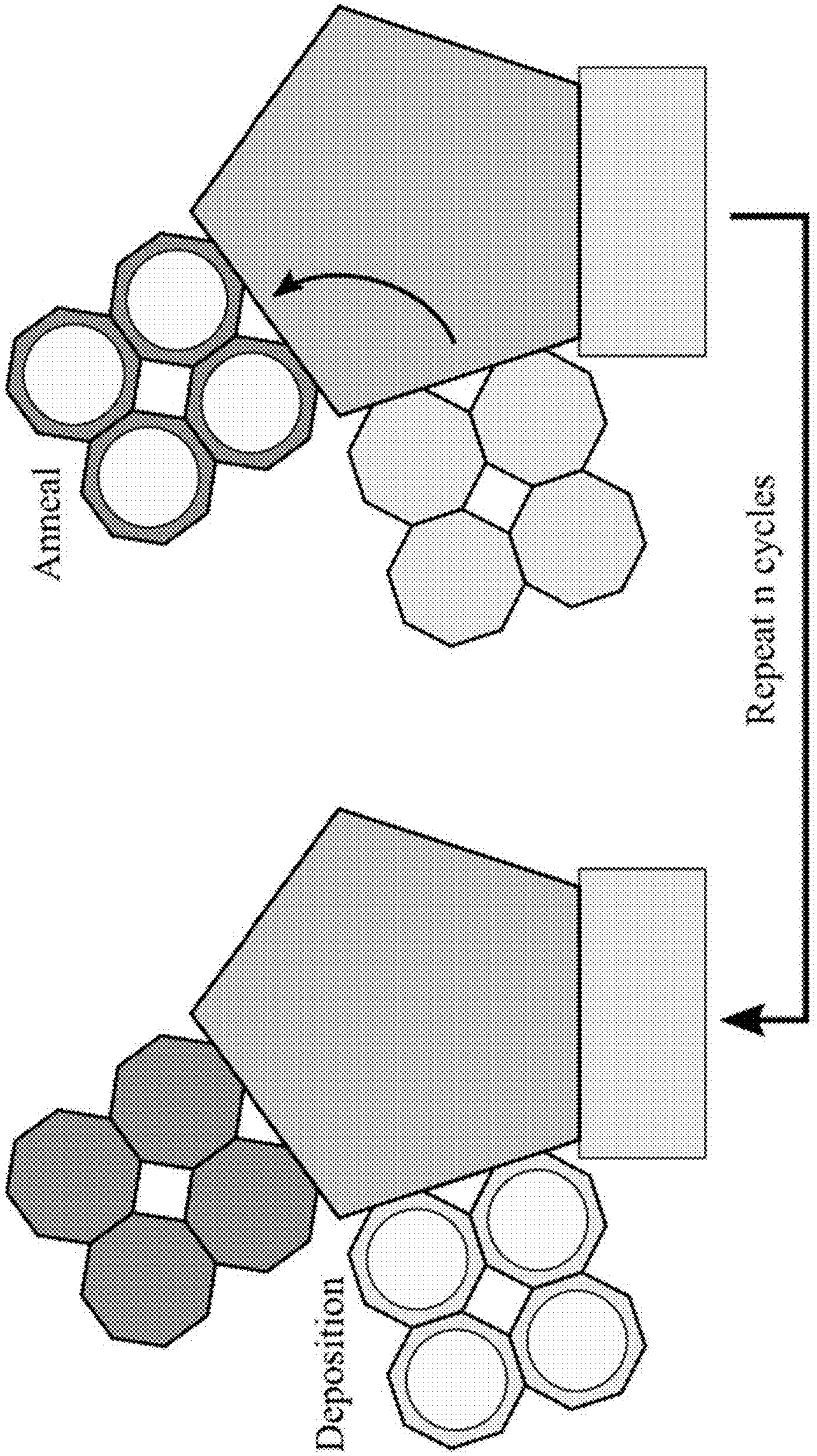
FIG. 3A illustrates a conventional apparatus for performing a deposition and subsequent anneal.

FIG. 3A illustrates a conventional apparatus for performing a deposition and subsequent treatment (e.g., thermal anneal and ultraviolet cure). As illustrated, a conventional apparatus may comprise one or more deposition chambers comprising one or more stations for performing deposition processes. The one or more deposition chambers may be separated from one or more treatment chambers via a wafer handling chamber or other transfer chamber. In the case of a typical cyclic treatment using multiple chambers, wafer transfer time between a deposition chamber and a treatment chamber through the transfer chamber can become even longer than processing times. To solve this issue, in some embodiments, a multi-process chamber module in which different processes are performed in a single chamber using separate stations can be used, and wafer transfer time may advantageously be reduced.

Thus, multi-process apparatuses having, for example, one or more low-temperature deposition stations and one or more treatment stations are described herein. In some embodiments, a cyclic process may be carried out in the stations of one chamber and a final anneal may be performed in the stations of a different chamber, for example in a different QCM.

Figure 3B:
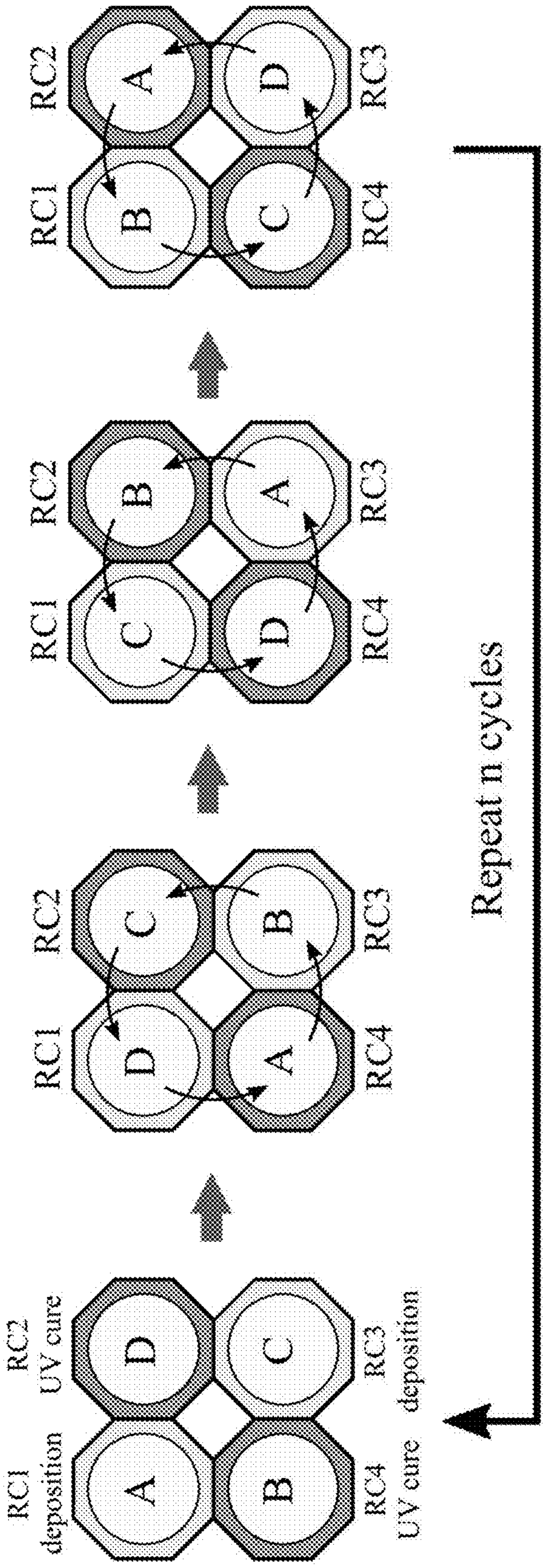
FIG. 3B illustrates a multi-process chamber module and process according to some embodiments herein.

FIG. 3B illustrates a multi-process chamber module according to some embodiments. In some embodiments, the multi-process chamber module may comprise a quad-station arrangement comprising two low-temperature deposition stations (shown as RC1 and RC3 in FIG. 3B). The remaining two stations (shown as RC2 and RC4 in FIG. 3B) may comprise treatment stations, where substrates may be annealed and exposed to UV light. In some embodiments, more stations may be present in a multi-process chamber module. Generally, additional stations would include at least one additional deposition station and at least one additional treatment station.

As used herein, "station" refers broadly to a location that can contain a substrate so that a process may be performed on the substrate in the station. A station can thus refer to a reactor, or a portion or a reactor, or a reaction space or reaction chamber within a reactor. In some embodiments, stations in accordance with embodiments herein are in "gas isolation" from each other or are configured to be in gas isolation while a substrate is processed inside the station. In some embodiments, the stations are in gas isolation by way of physical barriers but not gas bearings or gas curtains. In some embodiments, the stations are in gas isolation by way of physical barriers in conjunction with gas bearings and gas curtains. In some embodiments, after or concurrently with the placement of a substrate in a particular station, that substrate is placed in gas isolation from the other stations (so that process steps can be performed in that station), and after the substrate has processed in the station, the station is brought out of gas isolation, and the substrate can be removed from the station and positioned in an intermediate space. Substrates from multiple different stations can be placed in a shared intermediate space for movement from station to station. The stations can be placed in gas isolation, for example, by a physical barrier. In some embodiments, the stations are not placed in gas isolation. In some embodiments, one or more stations comprises a heating and/or cooling system, so that different precursors in different stations can process substrates at different temperatures at the same time. As such, in some embodiments, an entire first station is at a lower or higher temperature than an entire second station, or a first station comprises a susceptor that is at a lower or higher temperature than a susceptor in a second station, and/or a first precursor is flowed into a first station while a second precursor is flowed into a second station at a lower or higher temperature than the first station.

In some embodiments, the stations are separated from each other by solid materials, and are not separated from each other by gas bearings or gas curtains. In some embodiments, the stations are separated from each other by solid materials or gas curtains and are not separated from each other by gas bearings. In some embodiments, the stations are separated from each other by solid materials or gas bearings and are not separated from each other by gas curtains. Optionally, the physical barrier can move in conjunction with a moving stage that shuttles substrates between the stations and the intermediate space, so that the physical barrier places the station in gas isolation at the same time (or slightly before or slightly after) the substrate is placed in that station. Optionally the physical barrier can be used in conjunction with a gas barrier, for example to fill some gaps left by the physical barrier. In some embodiments, a physical barrier is provided, but a gas barrier or gas curtain does not.

In some embodiments, a station comprises a module or chamber of a reactor, so that each station comprises a separate chamber or module. In some embodiments, a station comprises a portion of a reaction chamber which can be placed in gas isolation from other portions of the reaction chamber by positioning a wall, a gas curtain or a gas bearing between the stations. Optionally, a given station is completely enclosed by one or more walls, gas curtains, gas bearings, or a combination of any of these items. However, in some embodiments, the stations are not separated.

As illustrated in FIG. 3B, during a gap-fill process according to some embodiments herein, wafers may be rotated through the stations. For example, a wafer may enter the chamber at station RC1, at which the wafer may undergo a first flowable deposition process. In some embodiments, after undergoing the first flowable deposition process, the wafer may be transferred to RC4, as shown in FIG. 3B. Alternatively, the wafer may be transferred to RC2. In either case, the wafer may undergo a first treatment process, which may include annealing and curing by exposure to UV light. After the first treatment process, the wafer may be transferred to RC3, where it may undergo a second flowable deposition process. After undergoing the second flowable deposition process, the wafer may be transferred to RC2 if it was previously transferred to RC4 or may be transferred to RC4 if it was previously transferred to RC2. In either case, the wafer may undergo a second treatment process that is similar to or the same as the first treatment process. The wafer may be transferred back to RC1 to complete a single deposition-treatment cycle. The cycle may be repeated to achieve desired film quality and thickness. Furthermore, the wafer may enter the chamber at any one of RC1, RC2, RC3, or RC4 and cycle through the stations in any direction. Generally, however, the deposition-treatment cycle will begin with at least one flowable deposition process followed by at least one treatment process. The at least one flowable deposition process may be performed simultaneously on different wafers and/or performed sequentially on a single wafer. In the illustrated embodiment of FIG. 3B, deposition stations and treatment stations of the same type are positioned diagonally. In some embodiments, this configuration may improve film uniformity. However, neighboring placement of stations of the same type is also within the scope of the embodiments disclosed herein. In some embodiments, two or more pairs of stations perform the same process on two or more substrates in parallel.

Figure 3C:
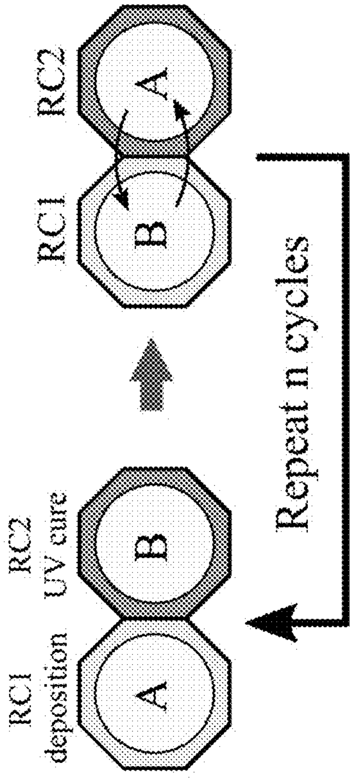
FIG. 3C illustrates a dual-chamber module and process according to some embodiments herein.

The above cyclic concept can also be applied to different numbers of stations. For example, a dual chamber module as illustrated in FIG. 3C may have a first station (RC1) for performing a low-temperature flowable deposition and a second station (RC2) for performing a treatment process, and substrates may be transferred cyclically between the first station and the second station. Thus, in some embodiments, a multi-process chamber module as described herein can comprise multiple stations, half of which may be used for flowable deposition and the other half of which may be used for treatment processes. In some embodiments, a multi-process chamber module comprises at least 2 stations, for example at least 2, 3, 4, 5, 6, 7, 8, 9, 10, 11, 12, 13, 14, 15, 16, 17, 18, 19, 20, 30, 40, 50, 100, 150, 200, 250, 300, 400, or 500 stations, including ranges between any two of the listed values. However, the number of stations is not necessarily limited.

Figure 3D:
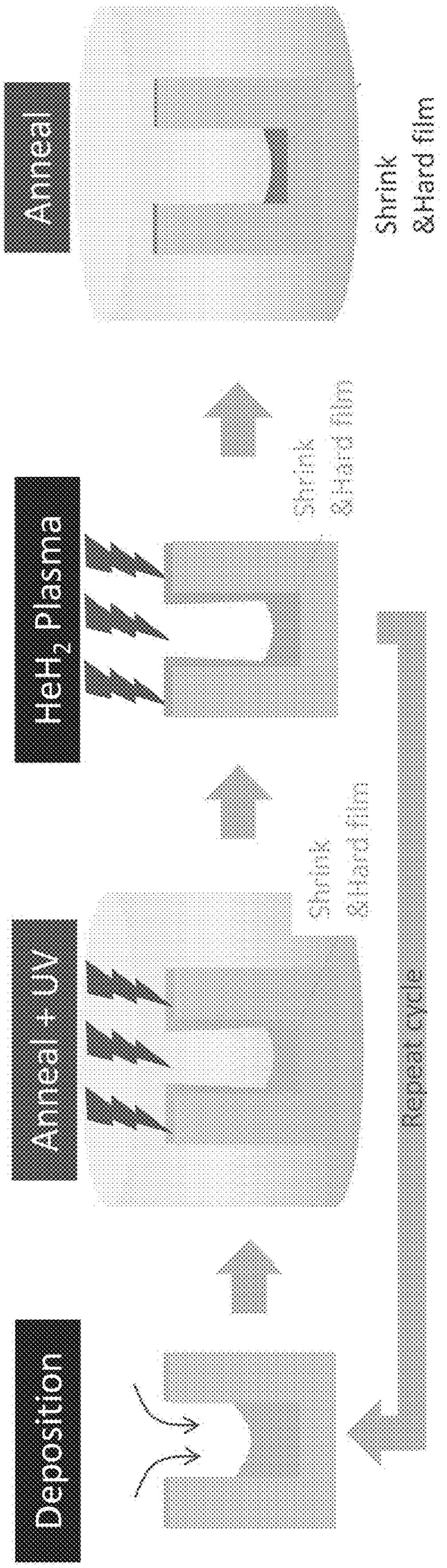
FIG. 3D illustrates a cyclic process according to some embodiments herein.

In some embodiments, all stations may be equipped with ultraviolet light sources, or half of the stations may be equipped with ultraviolet light sources (for example, for a cyclic process that has two steps that are repeated), or any other number of stations may be equipped with ultraviolet light sources. FIG. 3D illustrates an example process according to some embodiments that could be carried out on a system having one or more stations equipped with an ultraviolet light source. A substrate may undergo a film deposition step in a first station, then be transferred to a second station to undergo annealing and ultraviolet treatment to shrink and harden the film. Optionally, the film may be subjected to a plasma treatment (e.g., a He/$H_2$ plasma) to shrink and harden the film. The plasma treatment may be performed in the deposition station, in an annealing station (not shown), or in the annealing and UV treatment station. In some embodiments, plasma treatment in the UV treatment station may not be possible as RF components may be removed to allow the attachment of components for providing UV light. In some embodiments, the plasma treatment may be performed in a third station that is different from the deposition station and the annealing and UV treatment station. The process may be repeated until a film of desired quality and thickness is formed. In some embodiments, the film may be thermally annealed to shrink and harden the film.

Multi-Process Chamber Module

In accordance with some embodiments herein, a multi-process chamber module herein may comprise two or more stations for performing a flowable deposition and post-deposition treatment (e.g., annealing and UV curing) of a substrate. Optionally, the multi-process chamber module may also be configured to perform a plasma cure. In some embodiments, the multi-process chamber module may comprise a dual system gas-delivery and temperature control system, such that each station can be independently heated and different gases can be delivered to each station simultaneously. In some embodiments, each station of the multi-process chamber module may comprise a heater for heating the station independently from other stations of the multi-process chamber module. In some embodiments, the heater may comprise an aluminum nitride (AlN) ceramic heater or an anodized aluminum heater. In some embodiments, the heater may comprise one or more heat lamps for transmitting IR radiation to a surface of the substrate.

In some embodiments, the multi-process chamber module may comprise an integrated, single system exhaust and pump system, such that all stations can be maintained at a synchronized pressure simultaneously. Furthermore, the multi-process chamber module may comprise a single system radio frequency power source for providing radio frequency power to the stations. In some embodiments, radio frequency power may be provided independently to the stations. In some embodiments, the multi-process chamber module may comprise a lower chamber comprising a transfer space and an upper chamber comprising the process stations. In some embodiments, the lower chamber and the upper chamber may be unsealed. However, in some embodiments, the chambers may be sealed from each other.

Some embodiments herein provide a station for deposition that is in gas communication with a precursor source, such that a precursor can be flowed into the station. An apparatus in accordance with some embodiments herein comprises a first station and a second station. The apparatus can further comprise a controller set to control the movement of the substrate from station to station, the flow of precursors and process gases into stations, and/or the purging of stations. Different process gases can be contacted with a substrate at different temperatures that are appropriate for each particular precursor. In some embodiments, a precursor in a station is delivered via a showerhead. Optionally, the showerhead comprises a heated showerhead so as to provide the precursor to the station at a desired temperature or range of temperatures. In some embodiments, the heated showerhead provides the process gas to the station at or near the temperature at which the precursor contacts the substrate. Optionally, the showerhead comprises a vacuum exhaust scavenger around its perimeter to capture excess precursor and to minimize the amount of precursor that is potentially available to participate in CVD reactions with other gases. In some embodiments, precursors are contained within stations (and/or precursor source lines and/or purge lines) but are not permitted to enter any spaces between the stations.

In accordance with some embodiments herein, a substrate is shuffled between two or more stations, in which each station performs a deposition or treatment process. For example, a first station can provide a precursor that is adsorbed onto an exposed surface of the substrate at a first temperature, and a second station can perform a treatment (e.g., a thermal treatment and a UV treatment) of the substrate at a second temperature different from the first temperature. The substrate can be repeatedly shuffled back and forth between the first and second stations until a void-less, seam-less gap-fill is formed. In some embodiments, the substrate moves continuously between stations. In some embodiments, the motion of the substrate between stations is not continuous, but rather comprises an indexing motion, such as a stop-start, or alternating slow-fast motions.

In some embodiments, the substrate is moved from one station to the next station in the process sequence (e.g. movement time between the first station and the second station, and not necessarily including time in the station) in less than 15,000 milliseconds (msec), for example less than 10,000 msec, 9,000 msec, 8,000 msec, 7,000 msec, 6,000 msec, 5,000 msec, 4,000 msec, 3,000 msec, 2,000 msec, 1,000 msec, 500 msec, 250 msec, or 100 msec, including ranges between any two of the listed values, for example 10,000-15,000 msec, 100-15,000 msec, 1,000-10,000 msec, 1,000-5,000 msec, 1,000-4,000 msec, 1,000-3,000 msec, 1,000-2,000 msec, 1,000-1,500 msec, 3,000-1,0000 msec, 3,000-5,000 msec, 3,000-4,000 msec, 100-500 msec. 100-400 msec, 100-300 msec, or 100-200 msec. Optionally, the substrate can be shuffled between two or more stations that are separated by solid materials such as walls, rather than gas bearings or gas curtains. Optionally, the substrate is shuffled between stations along a circular path or arc rather than a linear path. Optionally, the substrate is shuffled between stations along a linear path rather than an arc or circular path. It is also contemplated that moving a substrate from station-to-station without passing through any additional locations in accordance with some embodiments herein can increase throughput by minimizing handling time. Optionally, the substrate is moved directly from a first station to a second station without passing through an additional location.

It is noted that if two different stations comprise two different processes, different station conditions, for example different temperatures can be maintained in the different stations. For example, a first station can be at a first temperature optimized for a first process at the first station, and a second station can be at a second temperature optimized for a second process at the second station. As such, in some embodiments, the whole first station is at a different temperature than the whole second station. In some embodiments, the whole first station is at a different temperature than the whole second station, but the two stations are at the same pressure.

Optionally, a station is further in gas communication with a purge gas source and/or a vacuum, so that the station can be purged. For example, in accordance with some embodiments herein, after a substrate is contacted with a precursor at a first station (but before the substrate is moved to a second station), the station can be purged while the substrate remains in the first station so as to minimize or eliminate the possibility of any lingering precursor being transported to the second station along with the wafer.

Optionally, one or more stations in accordance with some embodiments herein comprise a susceptor on which a substrate can be placed. The susceptor can be heated or cooled, and thus can be configured to heat or cool a substrate to a suitable temperature. As such, in some embodiments, a susceptor in the first station is heated or cooled to a first temperature, while a susceptor in the second station is heated or cooled to a second temperature. Furthermore, in some embodiments, the susceptor can heat or cool the substrate for different durations so as to allow the substrate to reach the appropriate temperature. In some embodiments, cooling and/or heating susceptors may be necessary to maintain the large temperature differences between deposition stations and anneal stations. Optionally, the susceptor can have a lower mass than the substrate, so that the susceptor can be heated or cooled more rapidly than the substrate. In other embodiments, the susceptor may have a larger mass than the substrate, such that the substrate can be heated or cooled faster than the susceptor. Optionally, the susceptor does not move from station to station. Optionally, the susceptor comprises a heated and/or cooled susceptor. In some embodiments, the susceptor is at an appropriate temperature for deposition of a precursor before the substrate is placed on the susceptor. In some embodiments, the susceptor is heated to an appropriate temperature for deposition of a precursor after the substrate is placed on the susceptor.

A deposition station according to the embodiments herein may comprise a gas injection system fluidly coupled to a reaction space, a first gas source for introducing a precursor and optionally a carrier gas (e.g., He) into the reaction space, a second gas source for introducing a mixture of one or more process gasses into reaction space, an exhaust, and one or more controllers, wherein the controller(s) are configured to control gas flow into the gas injection system to carry out the methods as described herein. The controller(s) are configured to be in communication with the various power sources, heating systems, pumps, robotics, and gas flow controllers or valves of the reactor, as will be appreciated by the skilled artisan. In some embodiments, the gas injection system comprises a precursor delivery system that employs a carrier gas for carrying the precursor to the reaction space. In some embodiments, the controller may comprise a processor that provides instructions to the apparatus to control a cycle of: (a) placing a substrate in a first station; (b) contacting the substrate in the first station with a precursor at a first temperature, wherein the contacting with the precursor forms a flowable film layer within a gap of the first substrate; (c) after contacting the substrate in the first station with the precursor, placing the substrate in the second station; (d) performing a UV cure and thermal anneal on the first substrate by exposing the first substrate to UV light and heating the first substrate to a second temperature in the second station to densify the first flowable film layer. In some embodiments (a)-(d) are repeated in a cycle until a film of desired thickness is deposited on the substrate.

The apparatus can further comprise a substrate transfer system configured to place a substrate in a first station, and subsequently place the substrate in a second station after performing a first process (e.g., flowable deposition or anneal/UV cure) on the substrate in the first station. The apparatus can comprise an intermediate space or wafer transfer space. The substrate transfer system can comprise a substrate transfer member such as a spider configured to move the substrate within the intermediate space. In some embodiments, moveable barriers defining a station are moved, exposing the substrate to the intermediate space, and the transfer member transfers the substrate through the intermediate space to a different station, which may then be placed in gas isolation via moveable barriers. In some embodiments, the substrate transfer system of the apparatus comprises one or more substrate transfer mechanisms (e.g., moveable stages), in which each substrate transfer mechanism is associated with only one station and can shuttle a substrate between its station and the intermediate space. As such, a transfer mechanism for each station can move the substrate from a particular station to the intermediate space, or from the intermediate space to the station. For example, a moveable stage can raise and lower the substrate between the intermediate space, and the station associated with that particular moveable stage. In some embodiments, the substrate transfer mechanism, or stage or susceptor in the station that is configured to receive the substrate comprises a plurality of lift pins. When the lift pins are extended, a substrate sitting on the extended lift pins can be readily accessible to the substrate transfer member (e.g., spider) for pick-up or drop-off. When the lift pins are retracted, the substrate can be positioned on the appropriate surface (e.g., surface of the stage or susceptor). In the intermediate space, the substrate can be moved from one station to another, or from one substrate transfer mechanism (e.g., moveable stage) to another, for example via a rotational substrate transfer member such as a spider. Optionally, each substrate transfer mechanism (e.g., moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer member in the intermediate space. Optionally, after placing a substrate in a station (e.g., on a susceptor or stage) or on a substrate transfer mechanism associated with a station, the substrate transfer member is retracted into the intermediate space.

As used herein a "substrate transfer member" or "transfer member" refers to a structure such as a rotary member or spider that can move a substrate from a first station (or from a transfer mechanism associated with the first station) to a second station (or to a transfer mechanism associated with the second station). In some embodiments, the transfer system comprises a transfer member comprising a spider. A "spider," as used herein, refers to a wafer transfer member having multiple arms, each arm configured for engaging with a wafer through a spider end effector. The spider can be disposed centrally relative to a number of stations.

Figure 4:
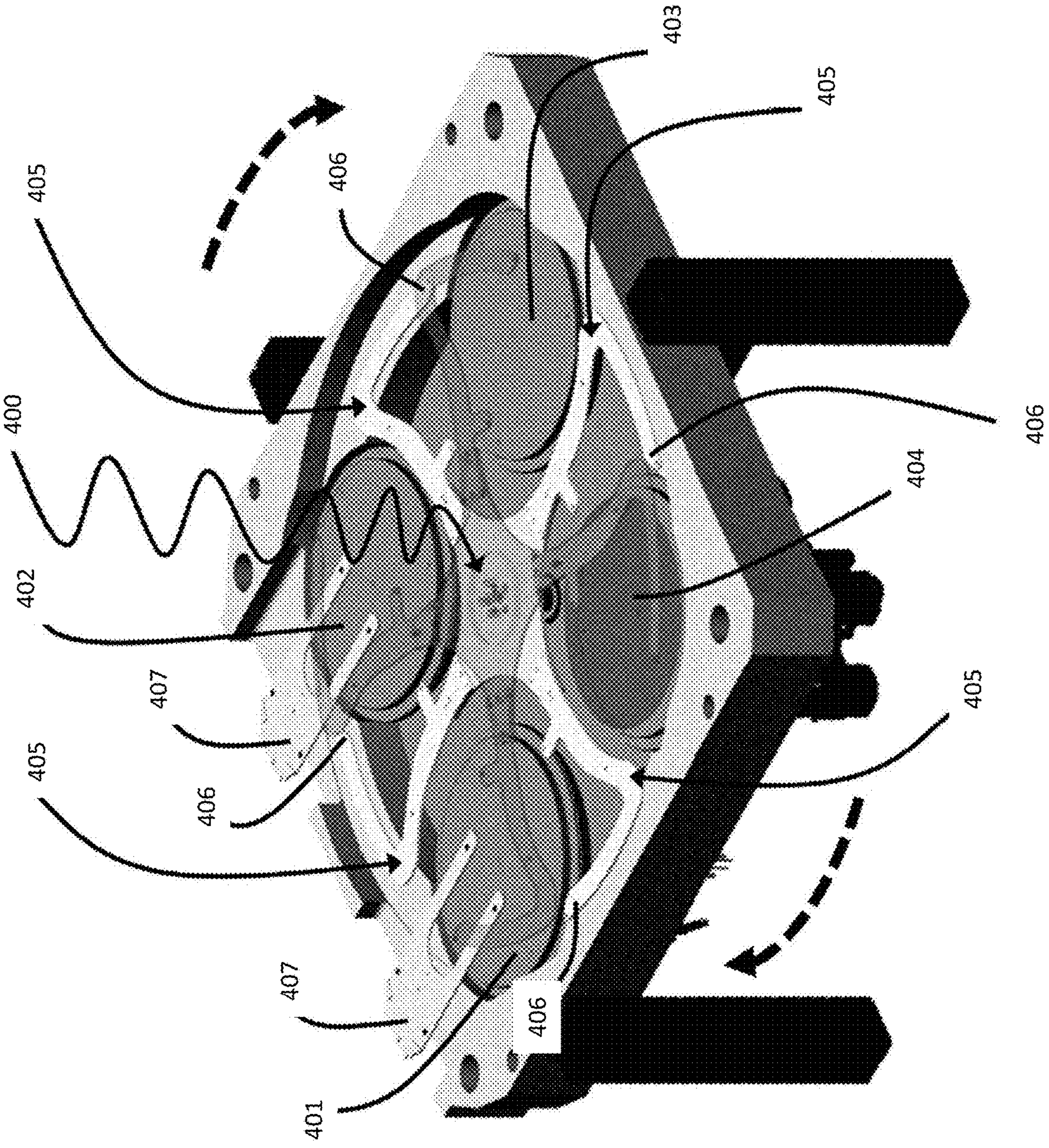
FIG. 4 illustrates a schematic drawing of a multi-process chamber module according to some embodiments herein.

FIG. 4 illustrates a schematic drawing of a multi-process chamber module according to some embodiments herein. In some embodiments, a multi-process chamber module may comprise a spider 400 centrally disposed relative to stations 401, 402, 403, and 404. The spider 400 may have one or more arms 405, each arm provided with a spider end effector 406 for engaging a wafer. When the wafers needed to be transferred, the wafers may be elevated by lift pins or similar structures, and the spider 400 is rotated so that the spider end effectors 406 are underneath the wafer and the spider end effectors 406 engage with the wafers. In some embodiments, the spider 400 is rotated over 90 degrees (or a different value, if there is a different number of stations; for evenly distributed stations, the value can be 460 degrees divided by the number of stations), the spider end effector 406 disengages with the wafers, leaving the wafers seated on a surface (e.g. on a susceptor in a station, or on a substrate transfer mechanism as described herein), which can also comprise lift pins or similar structures for elevating the substrate. Then the spider 400 can be moved to an intermediate position, in between the stations 401, 402, 403, 404, so that when the stations are brought in gas isolation with each other, the spider nor any of its constituting parts are exposed to any of the reaction gases. Optionally, additional end effectors 407 can move the wafer out of the cluster of stations, and into a wafer handling chamber, load lock chamber, and/or another cluster of stations. In some embodiments, the wafers can be transferred in a clockwise or counterclockwise rotation between stations 401, 402, 403, 404, wherein stations 401, 402, 403, 404 comprise either flowable deposition stations or treatment stations.

In some embodiments, the substrate transfer system comprises a plurality of "substrate transfer mechanisms," in which each substrate transfer mechanism is associated with only one station and can shuttle a substrate between a particular station and the intermediate space, for example by raising and lowering. Optionally, each substrate transfer mechanism (e.g., moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer mechanism in the intermediate space. As such, each substrate transfer mechanism is exposed to no more than one station. In some embodiments, each substrate transfer mechanism comprises a moveable stage.

Figure 5:
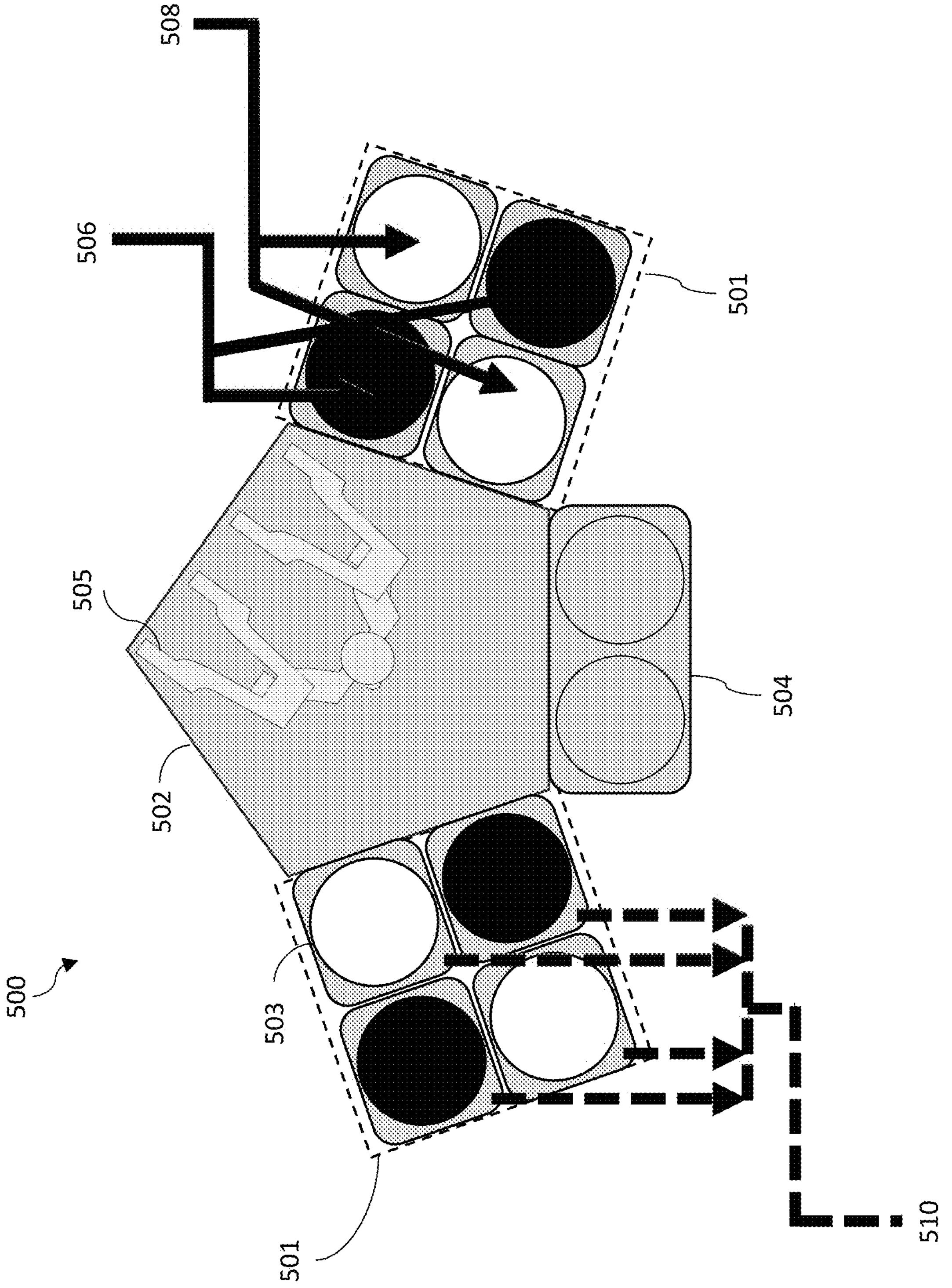
FIG. 5 illustrates a top-down diagram of a multi-process chamber module according to some embodiments herein.

FIG. 5 illustrates a top-down diagram of a multi-process chamber module according to some embodiments herein. Each multi-process chamber module 500 may comprise one or more process chambers 501, each process chamber comprising a one or more stations 503 in gas isolation from the other stations. In some embodiments, a spider 505 may move the substrate from process chamber-to-process chamber. An end effector stationed in a wafer handling chamber 502 (WHC) can add and remove substrates from the spider (in communication with the process chambers) and/or a load lock chamber 504 (LLC). As noted above, the multi-process chamber module may comprise a dual heating system comprising independent heating systems 506, 508. In some embodiments, heating system 506 may heat and/or cool one or more of the stations 503 independently from heating system 508 to a first temperature. Similarly, heating system 508 may heat and/or cool one or more of the other stations 503 independently from heating system 506 to a second temperature, different from the first temperature. This configuration enables different simultaneous processes in different stations, such as one or more deposition processes and one or more anneal processes. The multi-process chamber module 500 may also comprise a pressure system 510 comprising an exhaust and pump system. In some embodiments, the pressure system may be connected to all stations 503 in a reaction chamber 501, such that a same chamber pressure can be maintained in all of the stations 503 in the reaction chamber 501. In some embodiments, the stations 503 are not sealed from each other, such that each process space (i.e., upper chamber) is connected via an intermediate lower chamber space. In some embodiments, this lack of station separation allows for a less complex design, easier and faster wafer handling between stations, and a shared pressure system 510, such that deposition stations and anneal stations can be maintained at a same pressure simultaneously.

In some embodiments, a substrate processing equipment comprising one or more process module(s) (PM) is provided, in which a plurality of stations is located. The stations can comprise process spaces connected by an intermediate space (i.e., lower chamber). The substrate processing equipment can comprise at least two substrate transfer systems, one for moving substrates between the load lock chamber (LLC) and the PM, and the other for moving substrates between process stations in the PM. Optionally, the PM is equipped with a capability to run at least two different processes simultaneously in stations connected by an open intermediate space by independently controlling some process conditions such as gasses and temperature, but by sharing control of other process conditions such as pressure and RF.

In some embodiments, each station of the multi-process chamber module may comprise a heater for heating the station independently from other stations of the multi-process chamber module. In some embodiments, the heater may comprise an aluminum nitride (AlN) ceramic heater, an anodized aluminum anodized heater, and/or one or more IR heat lamps.

Figure 6A:
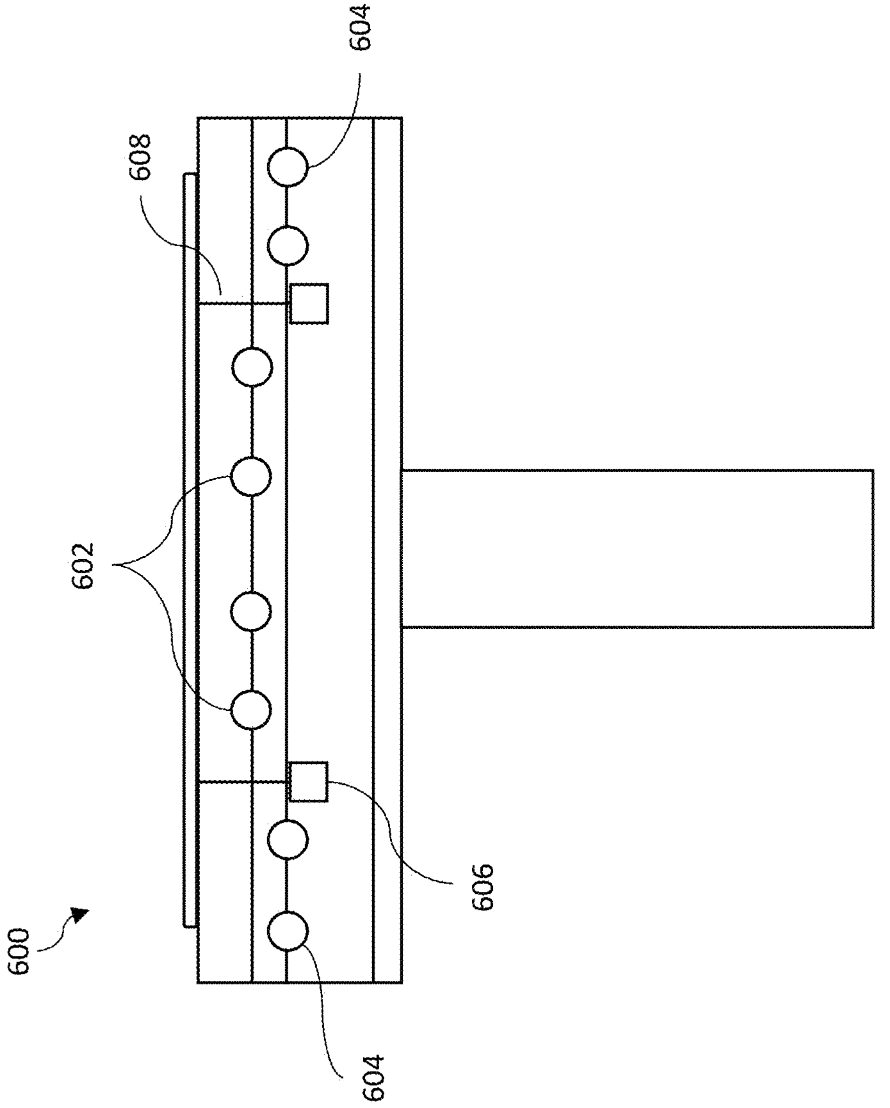
FIG. 6A illustrates an example diagram of a heating unit for use in a flowable deposition station according to some embodiments herein.

FIG. 6A illustrates an example diagram of a heating unit for use in a flowable deposition station according to some embodiments herein. The heating unit 600 may comprise one or more heating elements 602, 604, in a first and second heating zone, respectively. The heating elements may be located on a surface of or within the heating unit 600, which may be part of a susceptor for holding a substrate in a station of the multi-process chamber module. The heating elements may be powered to raise the temperature of the susceptor, substrate and/or station to a temperature suitable for flowable deposition. The heating unit 600 may also comprise a liquid cooling line 606 for cooling susceptor, substrate and/or station. A thermal isolation groove 608 may be provided to improve heating and/or cooling efficiency. For example, in some embodiments, the thermal isolation groove may separate the first and second heating zones to provide uniform heating to the wafer. In some embodiments, the heating unit may be configured to heat the susceptor, substrate and/or station to a temperature between about 20° C. and about 200° C. In some embodiments, the use of two heating zones effectively prevents unfavorable wafer temperature increases by plasma heat generation or wall temperature effects.

Figure 6B:
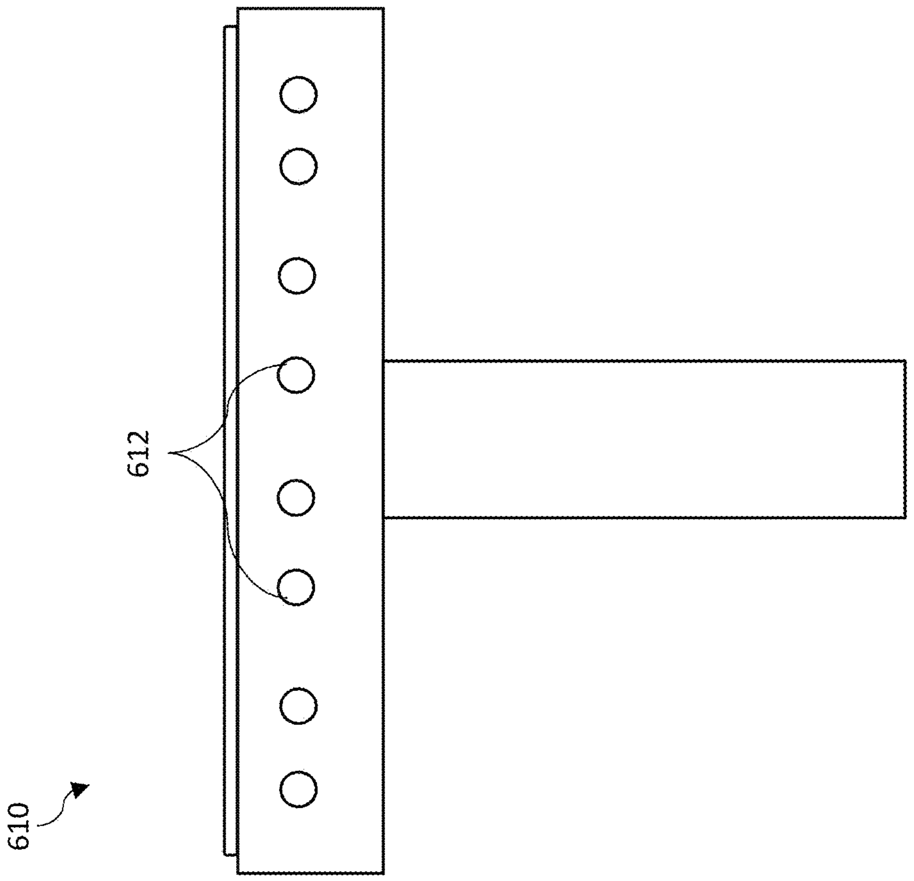
FIG. 6B illustrates an example diagram of a heating unit for use in a treatment station according to some embodiments herein.

FIG. 6B illustrates an example diagram of a heating unit for use in a treatment station according to some embodiments herein. The heating unit 610 may comprise one or more heating elements 612 in a single heating zone. In some embodiments, the heating unit may be configured to heat the susceptor, substrate and/or station to a temperature between about 400° C. and about 700° C.

While FIGS. 6A and 6B illustrate heating units with one heating zone or two heating zones, it will be appreciated that in some embodiments, heating units may have more than two heating zones. In some embodiments, a plurality of heating zones may be used to achieve greater temperature uniformity across a substrate, and heating zones may be able to counteract the effects or other nearby heat sources. In some embodiments, the heating zones may be configured to allow temperature to be controlled radially and/or axially. For example, in a multi-station reaction chamber, nearby heaters can make it difficult to achieve temperature uniformity. In some embodiments, the methods and apparatuses described in U.S. Patent Application No. 63/262,652, entitled "METHODS AND APPARATUSES FOR PREVENTION OF TEMPERATURE INTERACTION IN SEMICONDUCTOR PROCESSING SYSTEMS," filed Oct. 18, 2021, which is hereby incorporated by reference in its entirety and for all purposes, may be used to improve the uniformity of substrate heating a multi-station reaction chamber. For example, the methods and apparatuses described can enable improved uniformity when there are large temperature differences between stations, for example when a first station is at 75° C. and a second, neighboring station is at 400° C., 500° C., 600° C., or even more, or any number between these numbers.

Figure 6C:
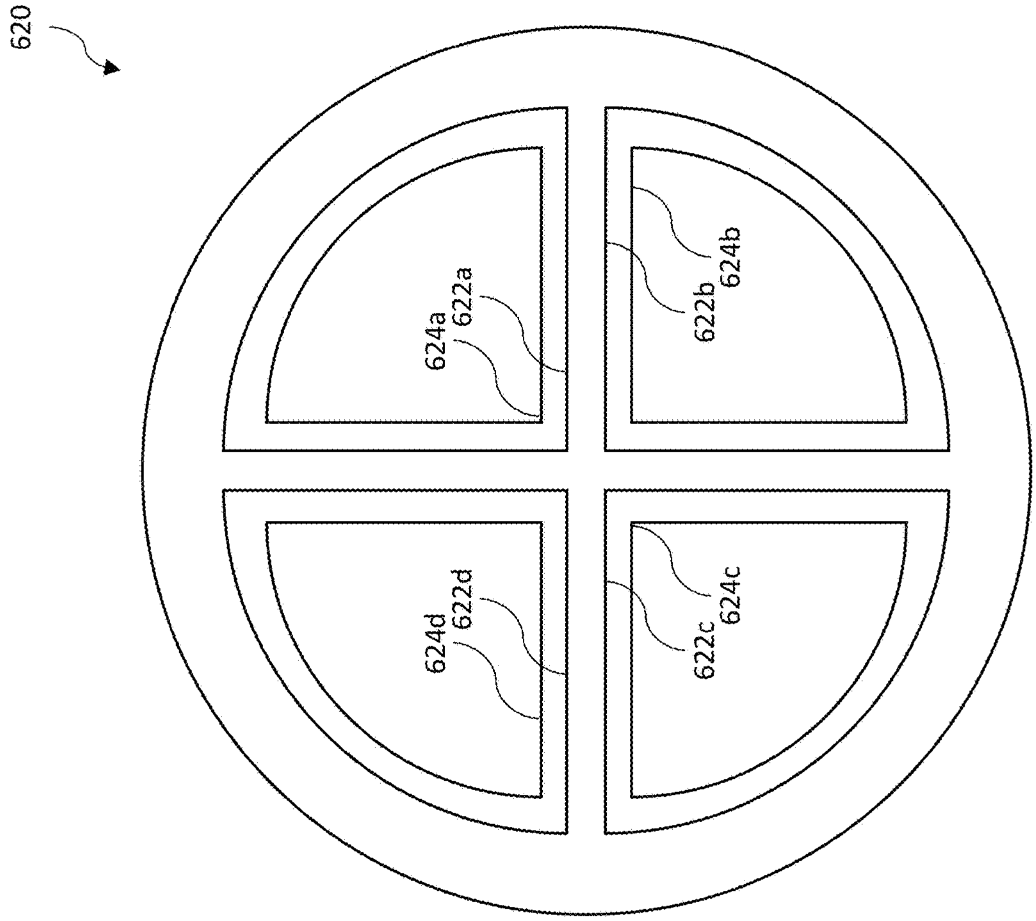
FIG. 6C illustrates an example diagram of a heating unit for use in a station according to some embodiments herein.

FIG. 6C illustrates an example diagram of a heating unit for in a station according to some embodiments. The heating unit 620 may have four heating elements 622*a*-622*d* and four cooling lines 624*a*-624*d*. As just one example, if a flowable deposition station is to the left of a treatment station that is at a higher temperature, the heating unit may be configured apply more power to heating elements 622*c* and 622*d* relative to heating elements 622*a* and 622*b*. In some cases, and/or may apply a greater cooling flow to cooling lines 624*a* and 624*b* than to cooling lines 624*c* and 624*d*.

Gap-Fill Methods

Various embodiments of the present disclosure relate to gap-fill methods, to structures and devices formed using such methods, and to apparatuses for performing the methods and/or for forming the structures and/or devices. Some embodiments relate to depositing flowable material in a deposition station and performing post-deposition treatment (e.g., a thermal anneal and ultraviolet cure) in a second station. Some embodiments include a plasma treatment which may be performed in the second station before, after, or during the thermal anneal and ultraviolet cure, or in some embodiments may be performed in the first station before or after depositing a flowable material. In some embodiments, a deposition process comprises introducing, in a deposition station, a substrate provided with a gap, the gap comprising a recess and a lateral space extending substantially laterally from the recess, introducing a precursor into the deposition station and introducing a plasma into the deposition station, whereby the precursor reacts to form a gap-filling fluid that at least partially fills the recess and the lateral space of the gap. In some embodiments, the deposition may comprise introducing one or more process gases in addition to the precursor into the deposition station. In some embodiments, another vapor phase process may be used to deposit a flowable material.

Gap-fill methods that deposit flowable materials often operate by flowing precursor molecules in a gaseous phase. The gaseous phase precursors may be formed into polymers by striking a plasma in a chamber filled with a volatile precursor that can be polymerized within certain process parameters. In some embodiments, the precursor may be selected from a list consisting of silylamines, silazanes, cyclosilazanes, and silicon alkylamines. Optionally, the gas phase can comprise a further gas apart from the plasma, for example a noble gas, hydrogen, a carrier gas, a dilution gas, and so forth. Process parameters can include, for example, partial pressure of a precursor during a plasma strike and wafer temperature. As used herein, polymerization can include the formation of longer molecules and need not necessarily include a carbon-carbon bond. Indeed, polymerization can include the formation of, for example, Si—Si bonds, Si—C bonds, and/or Si—N bonds. In some embodiments, the viscous material forms a viscous phase and can flow into a trench on the substrate which may be, for example, a silicon wafer. As a result, the viscous material may seamlessly fill the trench in a bottom-up manner. The formed polymers may be in a liquid phase and may flow (e.g., by capillary action) into gaps. Subsequent processing steps may be used to solidify the polymer. Typically, a cure step is used to harden the film.

Flowable films may be temporarily obtained when the volatile precursor is polymerized by a plasma and deposited on a surface of a substrate, wherein gaseous precursor (e.g., monomer) is activated or fragmented by energy provided by plasma gas discharge, thereby initiating polymerization, and when the resultant material is deposited on the surface of the substrate, the material shows temporarily flowable behavior. The film quality of the material deposited on the surface can be improved via a cyclic process including thermal treatment and UV treatment as described herein.

In some embodiments, a volatile precursor can be polymerized within a certain parameter range mainly defined by partial pressure of the precursor during a plasma strike, wafer temperature, and total pressure in the reaction chamber. In order to adjust the "precursor partial pressure," an indirect process knob (e.g., dilution gas flow) may be used to control the precursor partial pressure. The absolute number of the precursor partial pressure may not be required to control flowability of a deposited film. Instead, a ratio of the flow rate of the precursor to the flow rate of the remaining gas and the total pressure in the reaction space at a reference temperature can be used as practical control parameters.

A gap in a substrate may refer to a patterned recess or trench in a substrate. Accordingly, exemplary methods of filling a patterned recess or trench on a substrate include providing a substrate comprising the recess/trench in a reaction space, providing a precursor to the reaction space, thereby filling the recess with the precursor, and providing a plasma to form a viscous phase of the precursor in the recess, wherein the viscous phase of the precursor flows and deposits or forms deposited material in the bottom portion of the recess relative to sidewalls and/or a top portion of the substrate away from the recess.

In some embodiments, gap-filling deposition methods include the use of a radio frequency (RF) plasma and pulsed precursor flow. In some embodiments, process parameters may be changed to achieve high enough partial pressure during the entire RF-on period for polymerization to progress, and to provide sufficient energy to activate the reaction (defined by the RF-on period and RF power). In some embodiments, temperature and pressure may be controlled for polymerization/chain growth and set above the melting point and below the boiling point of the flowable phase. In some embodiments, the process of filling a gap with a gap filling fluid comprises one or more of the following substeps. A substrate comprising the gap is positioned in a deposition station. The gap comprises a recess in fluid connection with one or more lateral spaces. In some embodiments, a precursor may be introduced into the deposition station. In some embodiments, one or more process gases may also be introduced into the deposition station. The process gasses may comprise one or more further gases including a co-reactant. In some embodiments, a plasma, such as an RF plasma, may be maintained in the deposition station. In some embodiments, the precursor may be reacted to form a gap filling fluid on the substrate. In some embodiments, the gap filling fluid may at least partially fill the plurality of recesses and the one or more lateral spaces. In some embodiments, the process gases and the precursor may be introduced simultaneously. In some embodiments, the precursor may be introduced before or after the process gases. In some embodiments, the RF plasma may be maintained before, during, or after introduction of the precursor and/or process gases. It will be understood by those skilled in the art that when the methods described above are carried out in a sequential manner, i.e., cyclically, a small amount of material may be deposited each cycle and the sequence of steps may be repeated until a layer with a desired thickness is obtained. In some embodiments, the process is carried out cyclically and one or more steps are separated by purge gas pulses.

In some embodiments, the above methods involve providing the precursor intermittently to the deposition station, and continuously applying a plasma. In some embodiments, the above methods involve providing the precursor intermittently to the deposition station, and intermittently applying a plasma. The latter embodiments thus feature the sequential application of precursor pulses and plasma pulses to the reaction space.

In some embodiments, process gasses may comprise, for example, Ar, He, $N_2$, $H_2$, $NH_3$, $O_2$, or a combination of one or more of the above. In some embodiments, precursors may only be introduced into deposition stations. In other words, deposition stations and treatment stations may comprise separated precursor gas connections.

Without being bound by theory or any particular mode of operation, it is believed that the depositing material desirably remains viscous or liquid throughout the deposition process and should not readily solidify or evaporate. It is further believed that under desirable reaction conditions, the vapor pressure of the liquid phase, but not that of the precursor, should be lower than total station pressure. Thus, it is believed that station temperature and pressure should be maintained at conditions under which the flowable reaction products exist as a liquid, and the precursor exists as a gas.

In some embodiments, the station pressure may be maintained at a pressure between around 300 Pa to 2800 Pa. For example, the station pressure may be maintained at about 300 Pa, about 350 Pa, about 400 Pa, about 450 Pa, about 500 Pa, about 550 Pa, about 600 Pa, about 650 Pa, about 700 Pa, about 750 Pa, about 800 Pa, about 850 Pa, about 900 Pa, about 950 Pa, about 1000 Pa, about 1050 Pa, about 1100 Pa, about 1150 Pa, about 1200 Pa, about 1250 Pa, about 1300 Pa, about 1350 Pa, about 1400 Pa, about 1450 Pa, about 1500 Pa, about 1550 Pa, about 1600 Pa, about 1650 Pa, about 1700 Pa, about 1750 Pa, about 1800 Pa, about 1850 Pa, about 1900 Pa, about 1950 Pa, about 2000 Pa, about 2050 Pa, about 2100 Pa, about 2150 Pa, about 2200 Pa, about 2250 Pa, about 2300 Pa, about 2350 Pa, about 2400 Pa, about 2450 Pa, about 2500 Pa, about 2550 Pa, about 2600 Pa, about 2650 Pa, about 2700 Pa, about 2750 Pa, about 2800 Pa, or any value between any of the aforementioned values.

In some embodiments, the deposition station temperature may be maintained at a temperature lower than about 300° C. For example, the station temperature may be maintained via a heating/cooling system at about 50° C., about 55° C., about 60° C., about 65° C., about 70° C., about 75° C., about 80° C., about 85° C., about 90° C., about 95° C., about 100° C., about 105° C., about 110° C., about 115° C., about 120° C., about 125° C., about 130° C., about 135° C., about 140° C., about 145° C., about 150° C., about 155° C., about 160° C., about 165° C., about 170° C., about 175° C., about 180° C., about 185° C., about 190° C., about 195° C., about 200° C., about 205° C., about 210° C., about 215° C., about 220° C., about 225° C., about 230° C., about 235° C., about 240° C., about 245° C., about 250° C., about 255° C., about 260° C., about 265° C., about 270° C., about 275° C., about 280° C., about 285° C., about 290° C., about 295° C., about 300° C., or any value between the aforementioned values.

In some embodiments, RF power may be provided to the station is between about 20 W and 1000 W. For example, in some embodiments, RF power may be provided to the station at about 20 W, about 40 W, about 60 W, about 80 W, about 100 W, about 120 W, about 140 W, about 160 W, about 180 W, about 200 W, about 220 W, about 240 W, about 260 W, about 280 W, about 300 W, about 320 W, about 340 W, about 360 W, about 380 W, about 400 W, about 420 W, about 440 W, about 460 W, about 480 W, about 500 W, about 520 W, about 540 W, about 560 W, about 580 W, about 600 W, about 620 W, about 640 W, about 660 W, about 680 W, about 700 W, about 720 W, about 740 W, about 760 W, about 780 W, about 800 W, about 820 W, about 840 W, about 860 W, about 880 W, about 900 W, about 920 W, about 940 W, about 960 W, about 980 W, about 1000 W, or any value between the aforementioned values.

In some embodiments, a film having a thickness of at least about 1 nm is deposited per cycle, for example about 1 nm, about 2 nm, about 3 nm, about 4 nm, about 5 nm, about 6 nm, about 7 nm, about 8 nm, about 9 nm, about 10 nm, about 15 nm, about 20 nm, about 25 nm, about 30 nm, about 35 nm, about 40 nm, about 45 nm, about 50 nm, about 60 nm, about 70 nm, about 80 nm, about 90 nm, or about 100 nm, including ranges between any two of the listed values, for example 1 nm-100 nm, 1 nm-20 nm, 1 nm-10 nm, 1 nm-5 nm, 2 nm-100 nm, 2 nm-20 nm, 2 nm-10 nm, 2 nm-5 nm, 3-4 nm, 5 nm-100 nm, 5 nm-20 nm, 5 nm-10 nm, 10 nm-100 nm, or 10 nm-20 nm.

Precursors and process gases may be provided to the stations at a volumetric flow rate of around 0.1 standard liter per minute (SLM) to about 10 SLM. For example, precursors and process gases may be provided to the stations at a volumetric flow rate of about 0.1 SLM, about 0.5 SLM, about 1 SLM, about 1.5 SLM, about 2 SLM, about 2.5 SLM, about 3 SLM, about 3.5 SLM, about 4 SLM, about 4.5 SLM, about 5 SLM, about 5.5 SLM, about 6 SLM, about 6.5 SLM, about 7 SLM, about 7.5 SLM, about 8 SLM, about 8.5 SLM, about 9 SLM, about 9.5 SLM, about 10 SLM, about 10.5 SLM, about 11 SLM, about 11.5 SLM, about 12 SLM, about 12.5 SLM, about 13 SLM, about 13.5 SLM, about 14 SLM, about 14.5 SLM, about 15 SLM, about 15.5 SLM, about 16 SLM, about 16.5 SLM, about 17 SLM, about 17.5 SLM, about 18 SLM, about 18.5 SLM, about 19 SLM, about 19.5 SLM, about 20 SLM, or any value in between the aforementioned values.

In some embodiments, the substrate comprises a semiconductor. In some embodiments, the semiconductor comprises silicon. Further provided herein is a structure comprising a semiconductor substrate comprising a plurality of recesses. The plurality of recesses is in fluid connection with one or more lateral spaces. Also, the plurality of recesses and the one or more lateral spaces are at least partially filled with a gap filling fluid upon completion of one or more deposition cycles. In some embodiments, the gap filling fluid completely fills at least 90%, preferably at least 95%, more preferably at least 99%, most preferably all of the plurality of recesses. In some embodiments, the gap filling fluid completely fills at least 90%, preferably at least 95%, more preferably at least 99%, most preferably all of the lateral spaces. In other words, the gap filling fluid preferably fills the entirety of each lateral space that is to be filled with gap filling fluid. In some embodiments, the gap filling fluid is substantially free of voids or seams.

In some embodiments, after deposition and/or the cyclic thermal anneal/UV cure, the substrate may undergo an $NF_3$ and $O_2$ cleaning process. In some embodiments, a plasma curing step may also be employed to further improve the gap-fill film quality. In some embodiments, the plasma curing step may employ a continuous direct plasma. Gap filling fluid deposition and direct plasma curing may be carried out cyclically. In some embodiments, this allows efficiently curing all, or at least a large portion, of the gap filling fluid. In some embodiments, the plasma curing step may involve the use of a micro-pulsed plasma. In some embodiments, the plasma curing step may be carried out cyclically, i.e., alternating cycles of gap filling fluid deposition and micro pulsed RF plasma are employed, though a post-deposition micro-plasma curing treatment is possible as well. The application of cyclic gap filling fluid deposition and plasma steps allows efficiently curing all, or at least a large portion, of the gap filling fluid.

In some embodiments, a cyclical gap-fill process may comprise performing a deposition step in a deposition station, performing a thermal anneal and ultraviolet cure step in a treatment station, and optionally repeating the deposition step and the thermal and ultraviolet treatment step until a film of desired thickness and quality is formed on a substrate. The cycle of deposition-treatment may be performed n times, wherein n is an integer. In some embodiments, after completion of one instance of a flowable deposition step and optional plasma curing step, a wafer may be transferred to a separate treatment station, where the wafer may undergo a thermal anneal and ultraviolet cure step. The thermal and ultraviolet treatment provided by the treatment stations may improve flowable film quality of, for example, SiCN or SiN films. In some embodiments, the cyclic anneal and ultraviolet treatment may comprise a heat treatment, including a thermal cure using He, Ar, $N_2$, $H_2$, or $O_2$, $NH_3$, or any combination of the aforementioned, followed by a wafer cleaning process using $NF_3$ and $O_2$. During the cyclic anneal, the wafer may be heated to a temperature between about 80° C. and about 700° C. For example, the wafer may be heated to a temperature between about 80° C., about 90° C., about 100° C., about 110° C., about 120° C., about 130° C., about 140° C., about 150° C., about 160° C., about 170° C., about 180° C., about 190° C., about 200° C., about 210° C., about 220° C., about 230° C., about 240° C., about 250° C., about 260° C., about 270° C., about 280° C., about 290° C., 300° C., about 310° C., about 320° C., about 330° C., about 340° C., about 350° C., about 360° C., about 370° C., about 380° C., about 390° C., about 400° C., about 410° C., about 420° C., about 430° C., about 440° C., about 450° C., about 460° C., about 470° C., about 480° C., about 490° C., about 500° C., about 510° C., about 520° C., about 530° C., about 540° C., about 550° C., about 560° C., about 570° C., about 580° C., about 590° C., about 600° C., about 610° C., about 620° C., about 630° C., about 640° C., about 650° C., or any value between the aforementioned vales. Similar pressure and gas conditions as those in the deposition chamber can be used to perform deposition and annealing simultaneously.

Figure 7A:
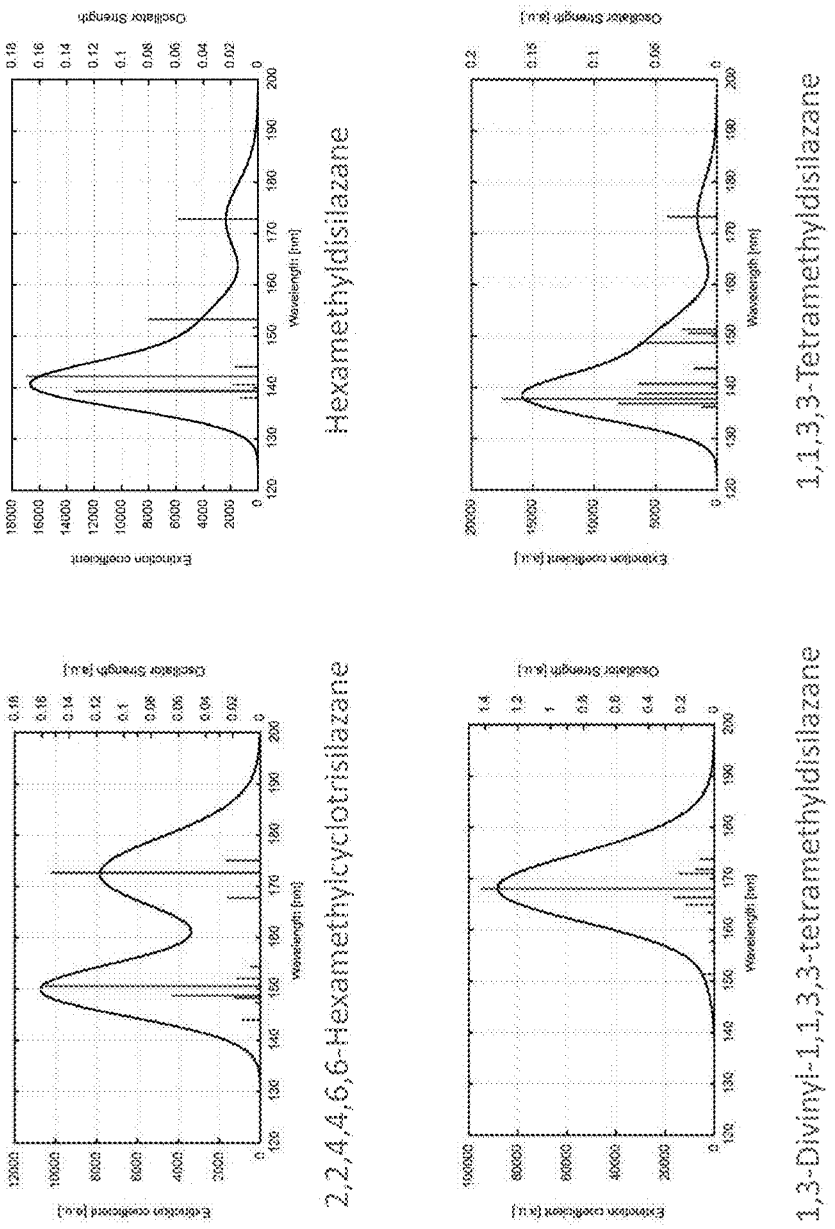
FIG. 7A illustrates calculated absorption spectra for precursor materials.
Figure 7B:
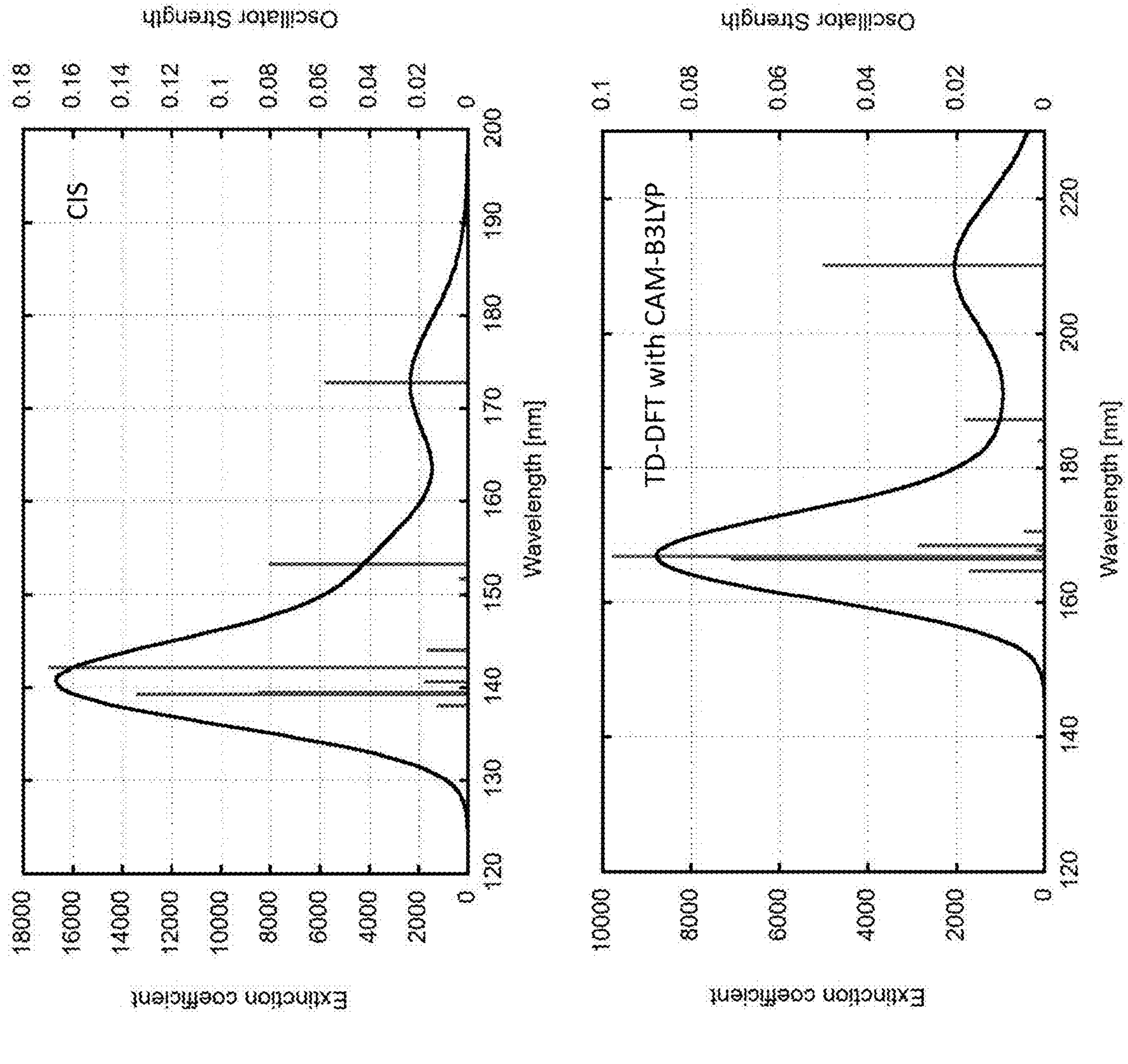
FIG. 7B illustrates a comparison of absorption spectra calculated using CIS and TD-DFT with CAM-B3LYP.
Figure 7C:
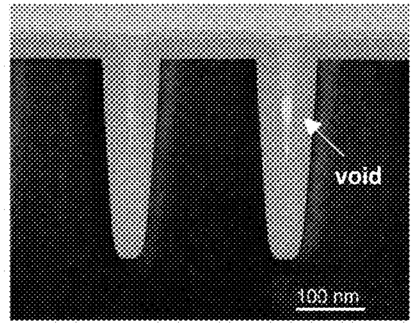
FIG. 7C illustrates film quality for films preparing according to some embodiments herein.
Figure 7C:
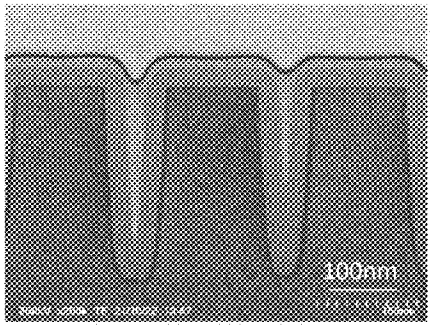

In some embodiments, the cyclic treatment may comprise an ultraviolet cure. For example, during the cyclic treatment, the substrate may be exposed to ultraviolet light. FIG. 7A shows simulated (CIS method) absorption spectra for various precursors. FIG. 7B shows a comparison of absorption calculations using CIS and Time-Dependent Density Functional Theory with CAM-B3LYP. CIS tends to underestimate wavelength, while TD-DFT tends to overestimate wavelength. The ultraviolet light may be generated by, for example, an excimer vacuums ultraviolet lamp which may advantageously generate a high average power over a narrow wavelength range. In some embodiments, a VUV lamp may use NeF, $Ar_2$, $Kr_2$, $F_2$, ArBr, $Xe_2$, ArCl, KrI, ArF, KrBr, or KrCl, as the working excimer molecule and may emit primarily at 108 nm, 126 nm, 146 nm, 158 nm, 165 nm, 172 nm, 175 nm, 190 nm, 193 nm, 207, or 222 nm. In some embodiments, other types of lamps capable of emitting light in the VUV region may be used. In some embodiments, lamps that emit over a broad spectrum, which may include wavelengths outside the vacuum ultraviolet region, may be used. In some embodiments, a low pressure mercury lamp may be used and may have a high emission at around 185 nm. During the cyclic UV treatment, the substrate may be exposed to ultraviolet light for about 5 s, about 10 s, about 20 s, about 30 s, about 60 s, about 120 s, about 300 s, about 600 s, any number between these numbers, or more if desired. In some embodiments, a post-deposition UV treatment may be applied for from about 10 s to about 1800 s, or any number between these numbers, or even more if desired. As shown in FIG. 7C, longer UV cure times can result in improved film quality with fewer voids. In some embodiments, only a single post deposition UV cure may be used, thus allowing for long curing times while still being viable for high volume manufacturing deployment. In some embodiments, the film may be exposed to UV light with a power density of about 1 $mW/cm^2$, about 5 $mW/cm^2$, about 10 $mW/cm^2$, about 15 $mW/cm^2$, about 20 $mW/cm^2$, about 25 $mW/cm^2$, about 50 $mW/cm^2$, about 75 $mW/cm^2$, about 100 $mW/cm^2$, about 125 $mW/cm^2$, about 150 $mW/cm^2$, about 200 $mW/cm^2$, any number between these numbers, or even more if desired. Higher intensity may result in improved results (for example, shorter curing times and/or improved film quality).

Figure 8A:
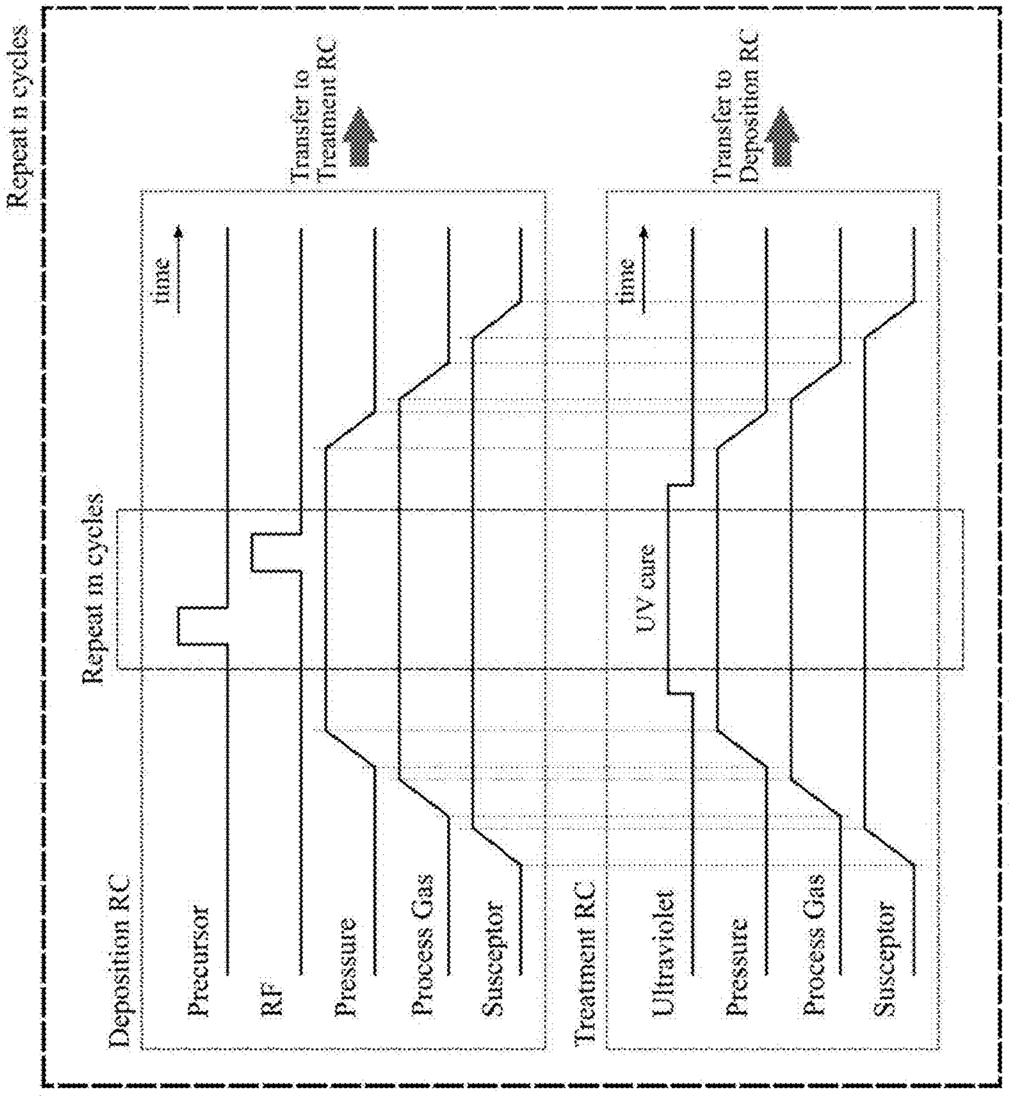
FIG. 8A illustrates an example gap-fill method using a repeated cycle of ALD and thermal and UV treatment according to some embodiments herein.
Figure 8B:
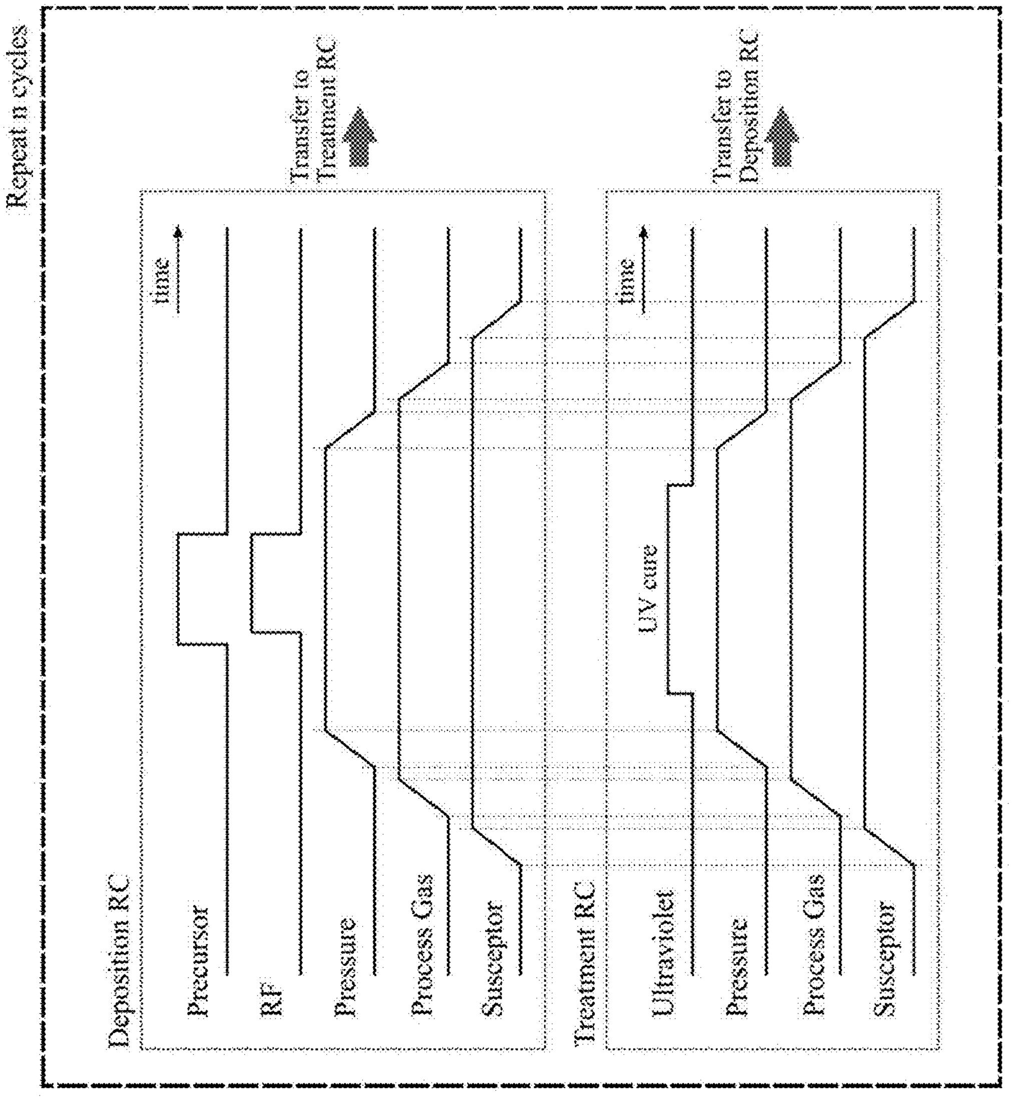
FIG. 8B illustrates an example gap-fill method using a repeated cycle of CVD and thermal and UV treatment according to some embodiments herein.
Figure 8C:
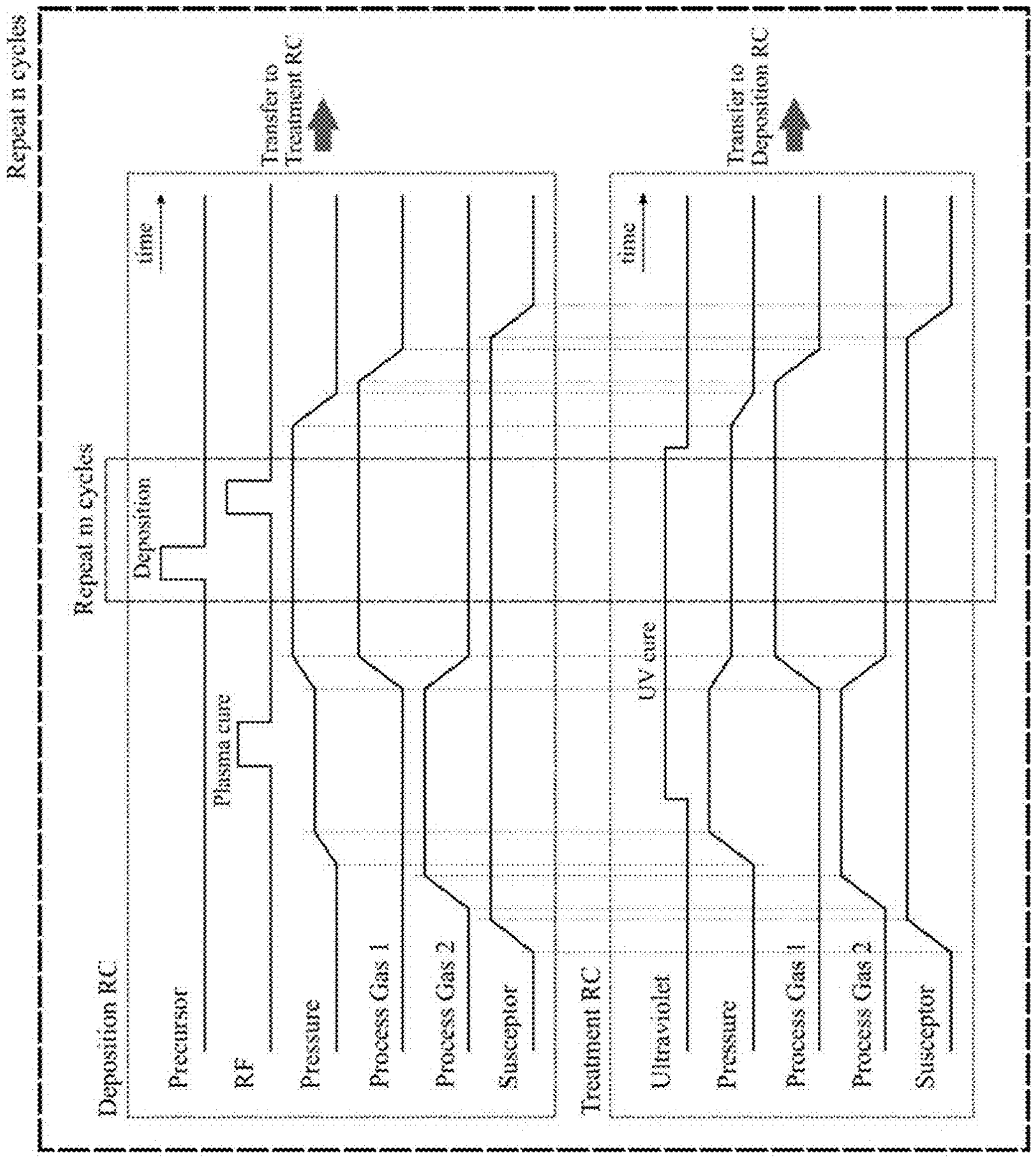
FIG. 8C illustrates an example gap-fill method using a repeated cycle of ALD and thermal and UV treatment with a plasma cure according to some embodiments herein.

FIGS. 8A-8C illustrate example embodiments of gap-fill methods using sequential application of precursor and plasma pulses. FIG. 8A illustrates an example gap-fill method using repeated cycle of vapor deposition, such as ALD, and treatment according to some embodiments herein. The process may employ a precursor and one or more process gases including a co-reactant. The one or more process gases may be continuously provided to the reactor chamber at a constant flow rate. Precursor pulses and RF pulses may be applied sequentially in the deposition station. The deposition station may be maintained at a consistent pressure and temperature during the gap-fill deposition. After completion of the deposition process, the wafer may be transferred to a treatment station to undergo a treatment process (e.g., thermal anneal and UV cure). In some embodiments, one or more process gases can be provided to the treatment station continuously while an anneal pressure and anneal temperature are maintained. In some embodiments, process gases used in a treatment station may comprise, for example, Ar, $O_2$, $H_2$, $N_2$, $NH_3$, He, and/or any combination of thereof. Ultraviolet light may be provided in the treatment station during the treatment process. Optionally, RF power is provided to the treatment station continuously or pulsed during the duration of the treatment. The ALD deposition-treatment cycle may be repeated any number of times to achieve desired film quality. In some embodiments, the ALD process and the treatment process may be employed simultaneously, wherein the ALD process is performed on a first substrate while the treatment process may be performed on a second substrate. In a dual chamber module, such as that illustrated in FIG. 3C, the first substrate and the second substrate can be exchanged between RC1 and RC2 repeatedly until a desired film quality is achieved on both substrates.

Figure 9:
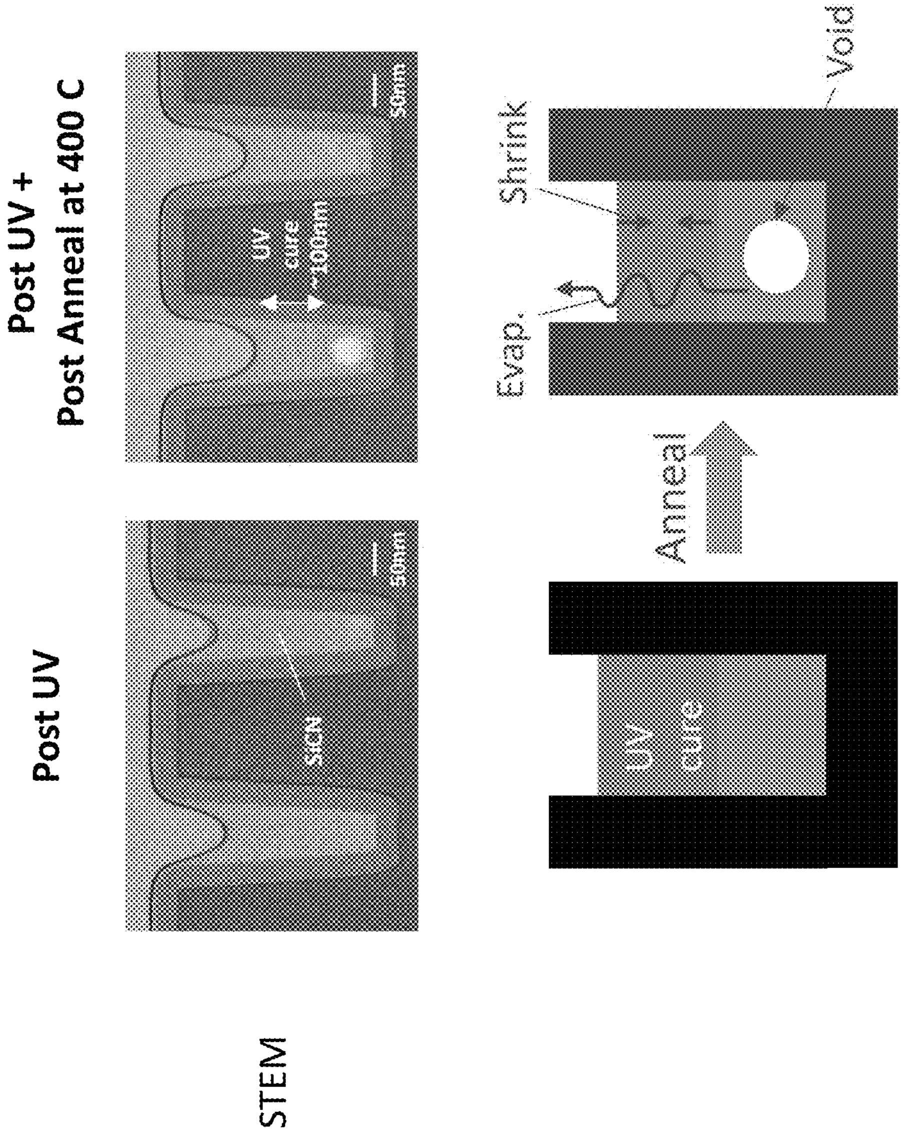
FIG. 9 illustrates a schematic diagram and microscopy images for films with voids according to some embodiments herein.

FIG. 8B illustrates an example gap-fill method using a repeated cycle of a vapor deposition process, such as CVD, and treatment according to some embodiments herein. In contrast to the ALD method, for CVD, the precursor and RF power may be applied concurrently. The treatment process may be substantially similar to the one employed after the ALD process. The CVD deposition-treatment cycle may be repeated any number of times to achieve desired film quality. In some embodiments, the CVD process and the treatment process may be employed simultaneously, wherein the CVD process is performed on a first substrate while the treatment process may be performed on a second substrate. In some embodiments, the anneal and ultraviolet treatment may be performed intermittently, such that the anneal and ultraviolet treatment is performed for every 1 nm to 5 nm of deposited film thickness or for every 5 nm to 100 nm of deposited film thickness. As shown in FIG. 9, when the SiCN film thickness is greater than about 100 nm, voids may form upon UV curing and thermal annealing.

FIG. 8C illustrates an example gap-fill method using repeated cycle of ALD and annealing with a plasma cure according to some embodiments herein. As with the ALD process of FIG. 8A, precursor pulses and RF pulses may be applied sequentially. However, after completion of the deposition process, a plasma cure treatment may be employed before or after UV curing, as discussed herein. In some embodiments, the plasma cure may be employed in a deposition station. In other embodiments, the plasma cure may be employed in an annealing station. In some embodiments, the plasma cure may be performed after the annealing/UV treatment step or a rapid thermal anneal/UV treatment. For example, in some embodiments, the anneal or rapid thermal anneal and UV treatment may de-gas one or more gases from the flowable film, and the plasma cure may create additional bonds in the remaining film. In some embodiments, the plasma cure comprises continuously providing one or more process gases to the station and RF pulsing. In some embodiments, the station pressure may be reduced or increased relative to the pressure during deposition-anneal process during the plasma cure. Furthermore, the process gases flowed into the station during the deposition-anneal process may be different than the process gases flowed into the station during the plasma cure. As shown in FIG. 8C, in some embodiments a system may be configured to perform a plasma cure in a deposition station prior to a deposition step (i.e., after an ultraviolet cure step). In some embodiments, the plasma cure step may be skipped for the first cycle (i.e., when the substrate enters the deposition RC for the first time, the plasma cure step may not occur as there has not yet been any film deposited).

Figure 8D:
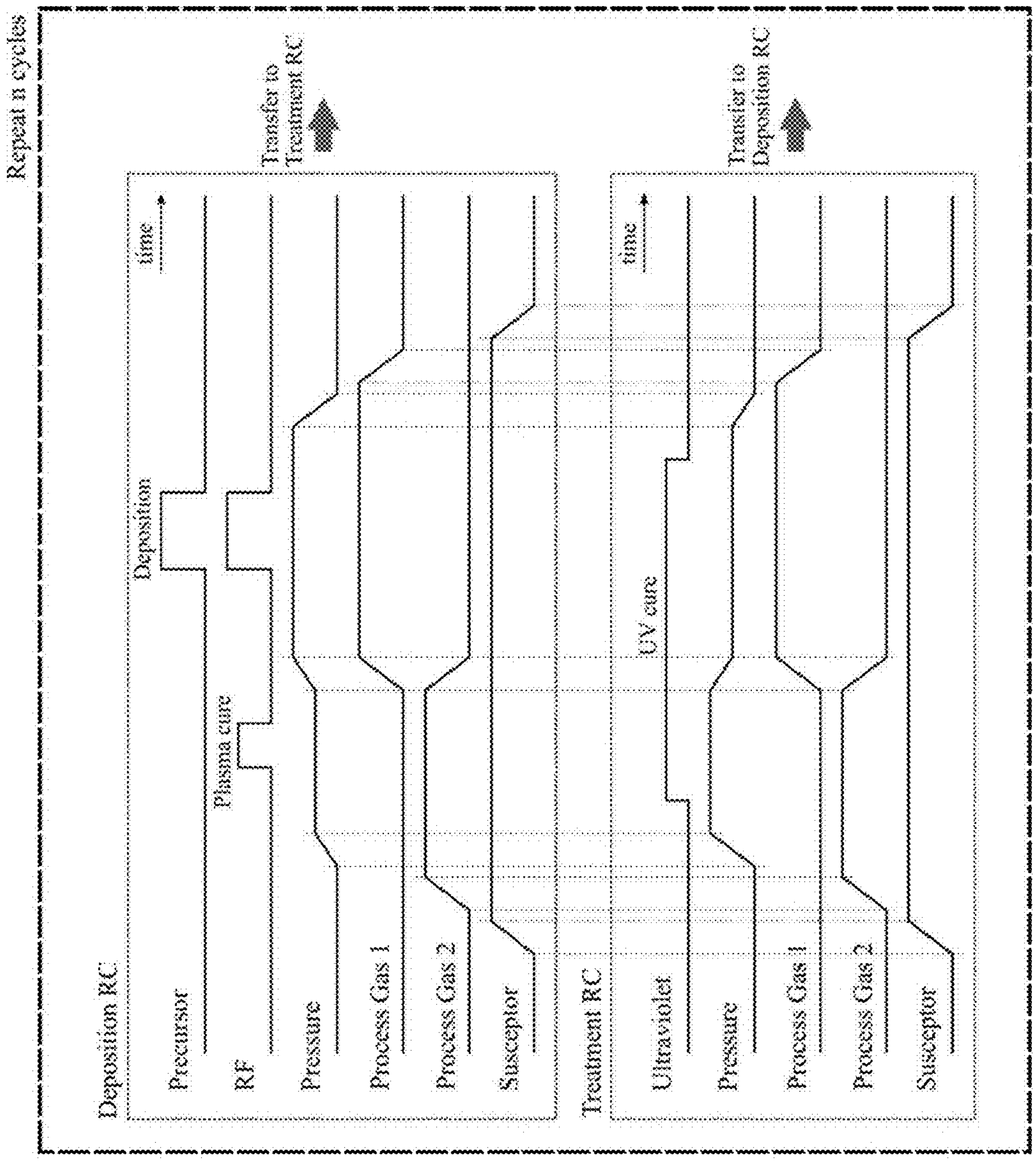
FIG. 8D illustrates an example gap-fill method using a repeated cycle of CVD and thermal and UV treatment with a plasma cure according to some embodiments herein.

FIG. 8D depicts an example CVD version of the process depicted in FIG. 8C As discussed above in relation to FIG. 8B, the CVD process differs principally from the ALD process in that the precursor and RF power may be applied concurrently.

Figure 8E:
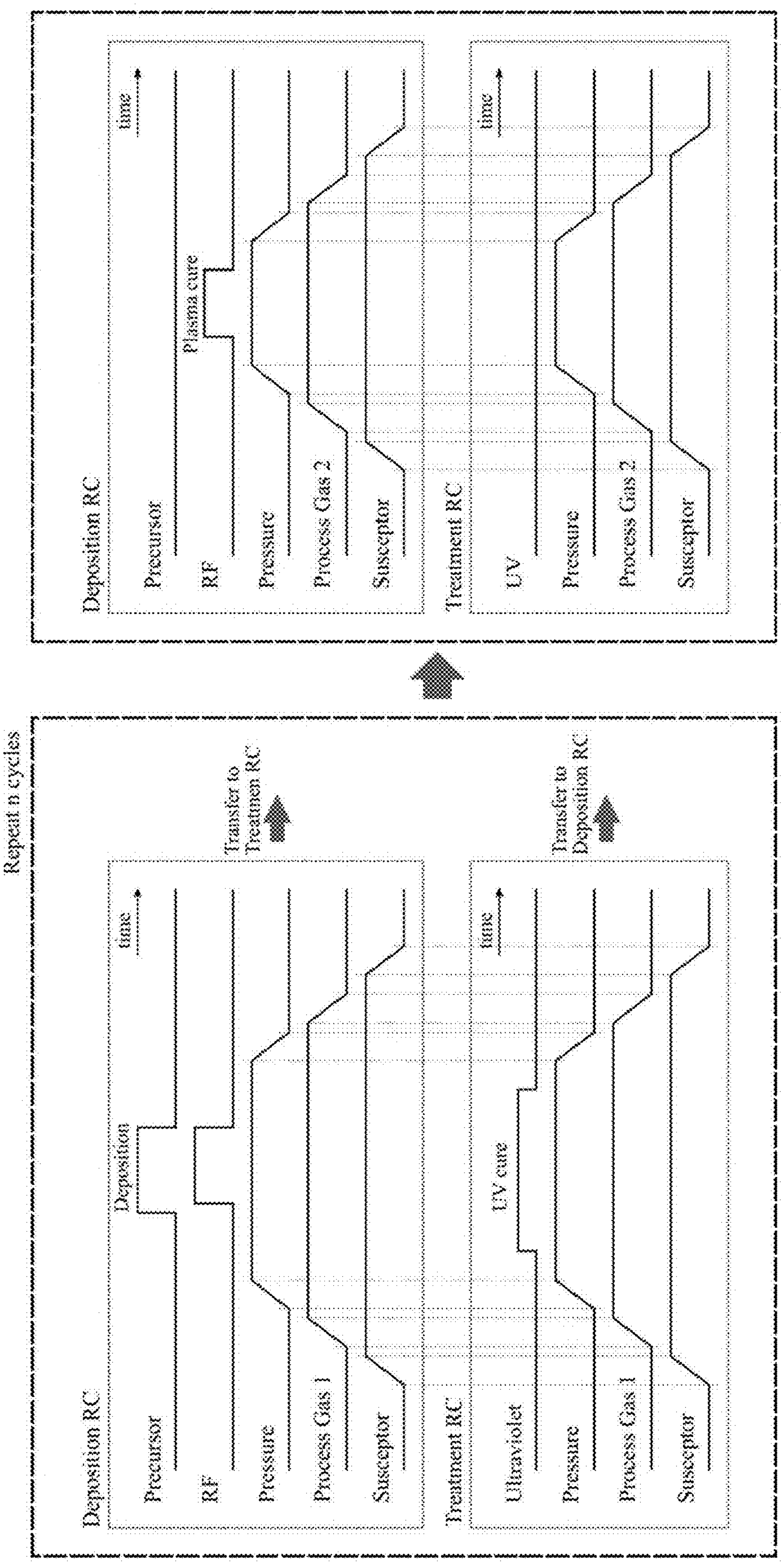
FIG. 8E illustrates an example gap-fill method using a repeated cycle of CVD and thermal and UV treatment followed by a post-deposition plasma cure according to some embodiments herein.

FIG. 8E depicts an example post-plasma cure sequence according to some embodiments. In some cases, frequent plasma cures can result in the formation of voids. Thus, in some embodiments, deposition and cure cycles may be repeated for n cycles, followed by a plasma cure step to improve the WERR of the surface.

Rapid Thermal Anneal

In some embodiments, the temperature difference between gap-fill stations in the multi-process chamber module described herein may be significant. For example, the flowable deposition stations may be maintained at less than 300° C. and the cyclic treatment stations may be maintained at about 450° C. In some embodiments, this may require complex hardware design. Additionally, in some embodiments, process times may be extended as the entire wafer must be heated and cooled for each treatment step.

In some embodiments, a Rapid Thermal Anneal may not be needed. For example, in some embodiments, UV irradiation is performed in parallel with deposition in the apparatus, for 10 s or longer. Thus, in some embodiments, rapid annealing is not necessary to minimize process time. In some embodiments, the temperature change between the deposition and UV cure has a negligible effect on chemical reactions, so there may be no need to minimize this time to improve chemical reaction. In some embodiments, for post high temperature annealing, Rapid Thermal Anneal may be applicable, but not necessary for only one time post annealing.

In some embodiments, the use of a cyclic Rapid Thermal Anneal (RTA) may be used as an alternative to the use of the thermal treatment, as described above. In this case, the wafer is heated rapidly by exposure to infrared (IR) radiation, which may cure the gap-fill material improving its properties and quality. RTA exposure times can be in the range of about 0.1 sec to about 10 sec and allow for relatively higher temperatures to be used as only the top surface of the wafer is heated. For example, in some embodiments, the RTA exposure time may be about 0.1 sec, about 0.2 sec, about 0.3 sec, about 0.4 sec, about 0.5 sec, about 0.6 sec, about 0.7 sec, about 0.8 sec, about 0.9 sec, about 1 sec, about 1.1 sec, about 1.2 sec, about 1.3 sec, about 1.4 sec, about 1.5 sec, about 1.6 sec, about 1.7 sec, about 1.8 sec, about 1.9 sec, about 2 sec, about 2.1 sec, about 2.2 sec, about 2.3 sec, about 2.4 sec, about 2.5 sec, about 2.6 sec, about 2.7 sec, about 2.8 sec, about 2.9 sec, about 3 sec, about 3.1 sec, about 3.2 sec, about 3.3 sec, about 3.4 sec, about 3.5 sec, about 3.6 sec, about 3.7 sec, about 3.8 sec, about 3.9 sec, about 4 sec, about 4.1 sec, about 4.2 sec, about 4.3 sec, about 4.4 sec, about 4.5 sec, about 4.6 sec, about 4.7 sec, about 4.8 sec, about 4.9 sec, about 5 sec, about 5.1 sec, about 5.2 sec, about 5.3 sec, about 5.4 sec, about 5.5 sec, about 5.6 sec, about 5.7 sec, about 5.8 sec, about 5.9 sec, about 6 sec, about 6.1 sec, about 6.2 sec, about 6.3 sec, about 6.4 sec, about 6.5 sec, about 6.6 sec, about 6.7 sec, about 6.8 sec, about 6.9 sec, about 7 sec, about 7.1 sec, about 7.2 sec, about 7.3 sec, about 7.4 sec, about 7.5 sec, about 7.6 sec, about 7.7 sec, about 7.8 sec, about 7.9 sec, about 8 sec, about 8.1 sec, about 8.2 sec, about 8.3 sec, about 8.4 sec, about 8.5 sec, about 8.6 sec, about 8.7 sec, about 8.8 sec, about 8.9 sec, about 9 sec, about 9.1 sec, about 9.2 sec, about 9.3 sec, about 9.4 sec, about 9.5 sec, about 9.6 sec, about 9.7 sec, about 9.8 sec, about 9.9 sec, about 10 sec, or any value between any of the aforementioned values.

In some embodiments, the RTA may be performed at relatively higher temperatures than the thermal treatment/anneal discussed above. For example, in some embodiments, an RTA may be performed at a temperature between about 80° C. to about 1000° C. In some embodiments, the RTA may be performed at about 80° C., about 105° C., about 130° C., about 155° C., about 180° C., about 205° C., about 230° C., about 255° C., about 280° C., 300° C., about 325° C., about 350° C., about 375° C., about 400° C., about 425° C., about 450° C., about 475° C., about 500° C., about 525° C., about 550° C., about 575° C., about 600° C., about 625° C., about 650° C., about 675° C., about 700° C., about 725° C., about 750° C., about 775° C., about 800° C., about 825° C., about 850° C., about 875° C., about 900° C., about 925° C., about 950° C., about 975° C., about 1000° C., or any value between the aforementioned values. In some embodiments, a higher temperature RTA may correspond to a lower exposure time.

As such, in some embodiments herein, a cyclic RTA may be utilized for curing flowable gap-fill. In some embodiments, a cyclic RTA may prevent redeposition, which is a problem in cyclic plasma treatments, while increasing throughput compared to a cyclic thermal treatment.

In some embodiments, in contrast to the multi-process chamber module apparatus and methods described above, during RTA, the substrate stage in the anneal station can be kept at the same temperature as the substrate stage in the deposition station, avoiding a temperature gap between treatments. As in the cyclic anneal, The RTA with IR-heating could be provided in a separate chamber to the flowable deposition, which requires wafer movement during each deposition-anneal cycle. However, in some embodiments, the RTA could be integrated in the deposition station itself to increase throughput. In some embodiments, using a single station may increase throughput and decrease the apparatus size. However, in some embodiments, when process gasses or desired process parameters (e.g., pressure) differ between the deposition station and thermal treatment, using a multi-station apparatus may be preferred.

In some embodiments, a deposition-RTA cycle may be repeated m number of times, wherein m is an integer. The value of m may depend on various process variables, including the growth rate of the flowable deposition process, on the volume of the gap structure to be filled, and whether the optional plasma cure is implemented. For example, in some embodiments, if a plasma cure is implemented, an RTA may be provided for every about 1 nm to about 5 nm of film growth. In some embodiments, if a plasma cure is not implemented, an RTA may be provided for every about 5 nm to about 50 nm of film growth.

As noted above, RTA substantially heats a top surface of wafer only. Thus, a temperature gap between stations is not required as it would be in multi-process chamber module conducting a flowable deposition and cyclic anneal. Furthermore, heating and cooling in RTA can be accelerated relative a cyclic anneal. The RTA approach avoids the redeposition effect observed in a cyclic plasma treatment and increases throughput compared to the cyclic thermal treatment.

High-Temperature Curing

In some embodiments, a film (e.g., a SiCN film) deposited as described above may exhibit some undesirable properties. For example, there may still be voids or seams, a wet etch rate may be undesirably high or unstable, or a surface may be undesirably rough. In some embodiments, a high temperature cure can improve film quality. However, a single step high-temperature cure may result in film desorption at high temperatures. Thus, in some embodiments, an additional QCM can be used for high temperature curing after a cyclic deposition process.

Figure 10:
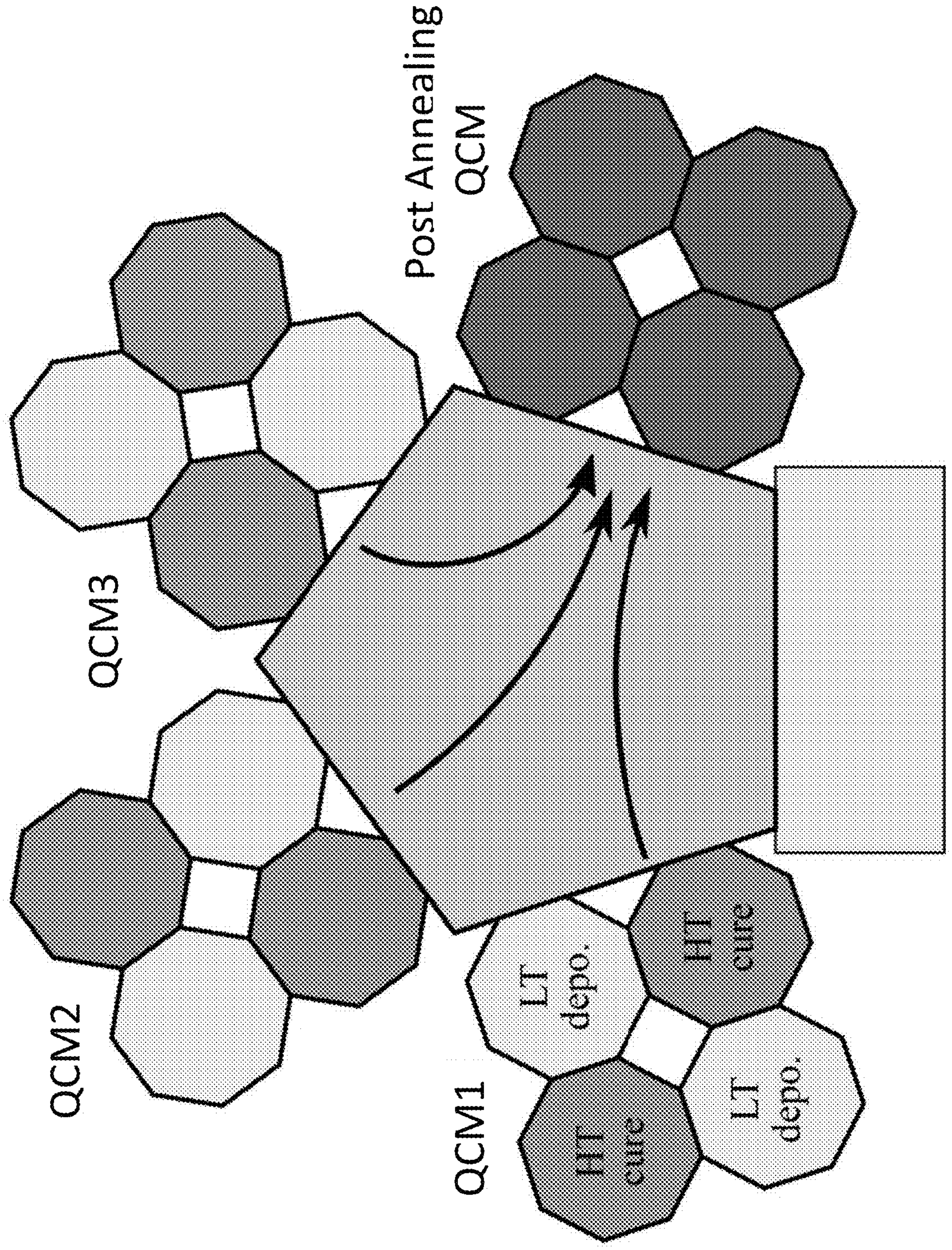
FIG. 10 illustrates an example apparatus for performing a cyclic deposition and subsequent anneal according to some embodiments herein.

FIG. 10 depicts an example apparatus for performing deposition according to some embodiments herein. In FIG. 10, an apparatus has three process QCMs for cyclic deposition processes as described herein and has a fourth annealing QCM for high temperature annealing. After completing a cyclic deposition process, wafers may be transferred from the process QCMs to the annealing QCM for annealing.

While FIG. 10 shows an apparatus with a separate QCM for annealing, it will be appreciated that a QCM is not necessary. For example, the annealing chamber may have 1 station, 2 stations, 3 stations, 4 stations, 5 stations, 6 stations, or more.

Figure 11:
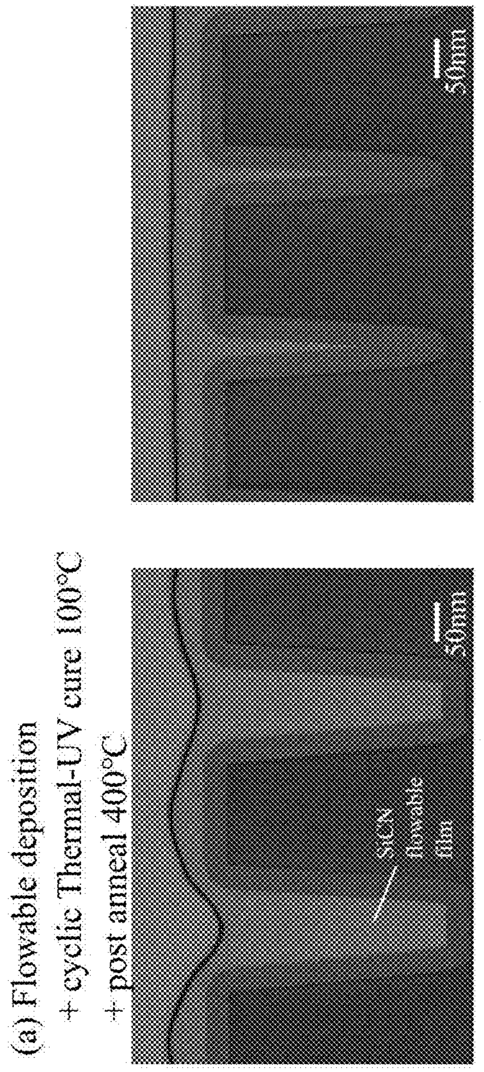
FIG. 11 illustrates microscopy images of a flowable SiCN film with a high temperature post-deposition anneal according to some embodiments herein.

FIG. 11 shows an image of a SiCN film deposited according to the methods described herein. During the cyclic deposition, a film may be heated to a relatively low temperature, for example, about 100° C. during the cyclic thermal/UV cure treatment. Film quality can be improved by subsequently annealing the film at a high temperature (e.g., about 400° C. or more). For example, the bulk WERR may be improved while the surface WERR is not substantially impacted. For example, a film deposited and treated with cyclic UV treatment at 100 degrees C. may have a surface WERR of about 1.9 and a bulk WERR of about 1.1. After annealing at 400 degrees C., the surface WERR may remain at around 1.9, while the bulk WERR may decrease to about 0.6.

Gap-Fill Precursors

As discussed briefly above, polymer precursors may be delivered in a gaseous phase and polymerized using a plasma. In some cases, precursors may be cyclic molecules such as, for example, 2,2,4,4,6,6-Hexamethylcyclotrisilazane. In some cases, such complex molecules can be advantageous because they have many reaction sites and thus can facilitate greater polymer cross-linking. For example, when energy is provided to 2,2,4,4,6,6-Hexamethylcyclotrisilazane, two reactive sites may be formed in the resulting fragment. However, complex precursor structures may also have several problems. For example, complex precursors may result in dangling bonds in the final film, which may decrease the quality of the film. Also, trimers can be formed with can result in poor flowability due to the large size.

(ii)

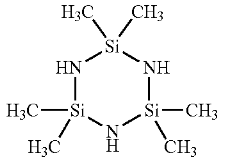

2,2,4,4,6,6-Hexamethylcyclotrisilazane

In some embodiments, it may be preferable to use simple precursors to form a SiCN flowable film, for example linear silylamine precursors. Simple precursors may have fewer reaction sites (for example, only one) which may reduce cross-linking. However, simple precursors may have increased flowability (for example, because only dimers can be formed, not higher polymers) and may have a reduced number of dangling bonds in the final film. In some cases, the use of relatively simple linear precursors may result in improved film quality and may reduce the processing requirements for curing the film (e.g., by reducing the curing temperature). In some embodiments, hexamethyldisilazane, 1,1,3,3-tetramethyl-1,3-divinyldisilazane, or 1,1,3,3-tetramethyldisilazane may be used as precursor molecules.

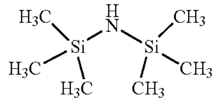

Hexamethyldisilazine

-continued

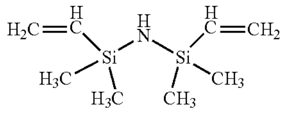

1,1,3,3-Tetramethyl-1,3-divinyldisilazane

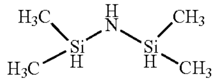

1,1,3,3,-Tetramethyldisilazane

Figure 12A:
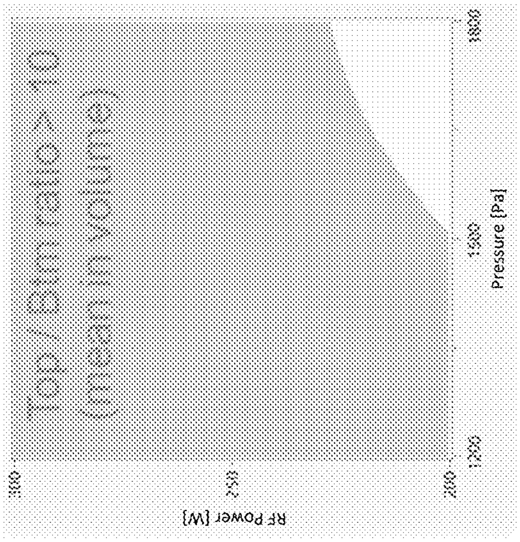
FIGS. 12A-12D illustrate top to bottom ratios at different radio frequency power and process pressure for various precursor materials according to some embodiments herein.
Figure 12B:
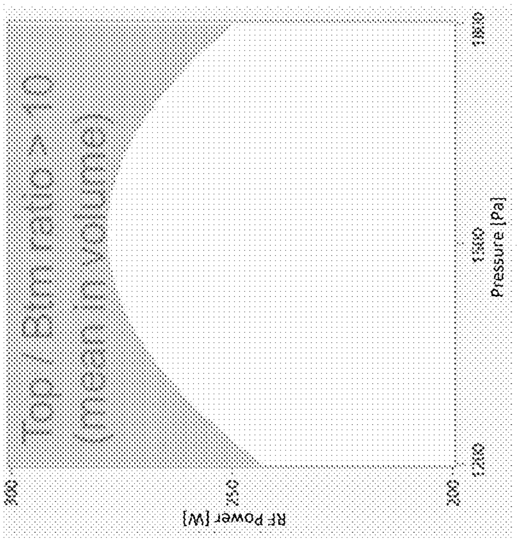
Figure 12C:
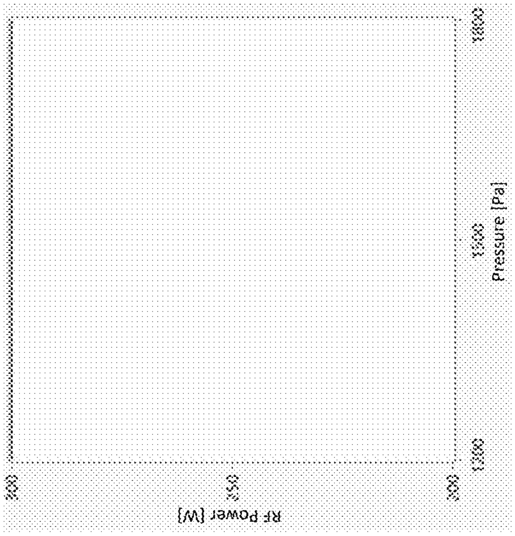
Figure 12D:
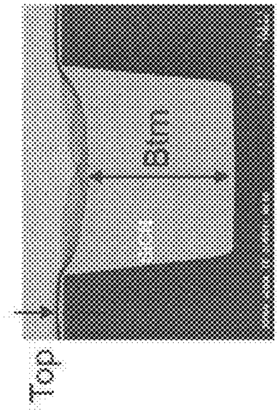

Simpler silylamine precursors may, in some embodiments, increase the process space (e.g., pressure, temperature, RF power, and so forth) in which a flowable film of high quality may be deposited. For example, as shown in FIG. 12A-C, simpler precursors may allow for deposition over a significantly wider range from pressures and RF powers. As shown in FIG. 12D, a film (e.g., a SiCN) film may flow into a channel in a substrate and reach a thickness within the channel ("btm"). Some material may form a film on the surface of the substrate ("top"). Preferably, the channel fills up while the surface remains relatively free of the film. Preferably, the ratio of the top film to the channel film may be about 1:5, 1:10, 1:20, or less, or any number between these numbers. As shown in FIG. 12A, the process space for the cyclic precursor 2,2,4,4,6,6-hexamethylcyclotrisilazane, denoted by the white area, is relatively small, bordered by a minimum pressure of about 1500 Pa and a maximum RF power of about 230 W. As shown in FIG. 12B, the process space for the linear precursor hexamethyldisilazane is significantly larger and can work at both lower pressure and higher RF power. As shown in FIG. 12C, the process space can be even larger for 1,1,3,3-Tetramethyl-1,3-divinyldisilazane.

Figure 13B:
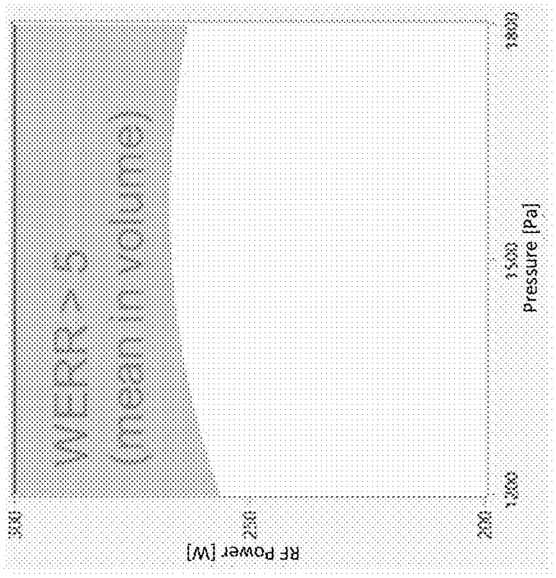
FIGS. 13A-13B illustrate wet etch rate ratio for films deposited from various precursor materials at different radio frequency power and process pressure according to some embodiments herein.
Figure 13A:
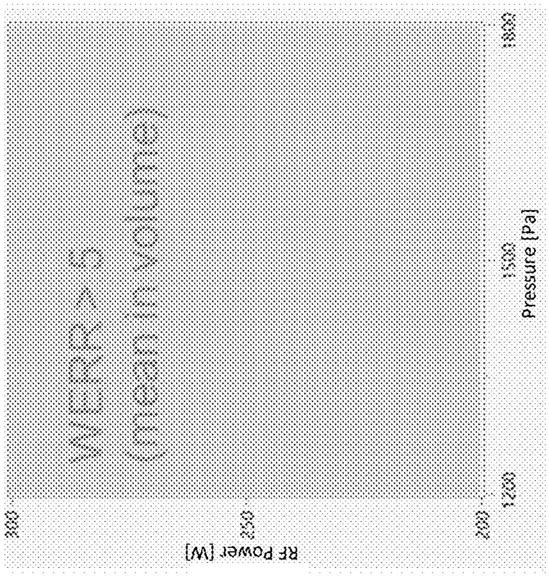

In addition to the larger processing space, linear silylamine precursors for SiCN flowable films can deliver superior film properties. A bulk SiCN film should preferably be resistant to chemical exposure and have a low enough each rate to allow for fine control during subsequent processing steps. In some embodiments, a wet etch rate ratio (WERR) may preferably be less than about 10, less than about 5, less than about 2, less than about 1, less than about 0.5, less than about 0.1, or any number between these numbers, or even less. It will be appreciated the WERRs shown in FIGS. 13A-13B represent the ratio of the SiCN etch rate to the etch rate for thermal oxide using dilute hydrofluoric acid (dHF). The dHF may be prepared by diluting 46% HF in a ratio of about 1:100 to yield a dHF concentration of about 0.5%. As shown in FIG. 13A, a bulk SiCN film made by flowing 2,2,4,4,6,6-hexamethylcyclotrisilazane can have a WERR greater than 5 across a broad range of deposition conditions (i.e., pressure and RF power). As shown in FIG. 13B, the WERR for a SiCN film using the precursor hexamethyldisilazane can be less than about 5 over a wide range of deposition pressures and RF powers.

Figure 14A:
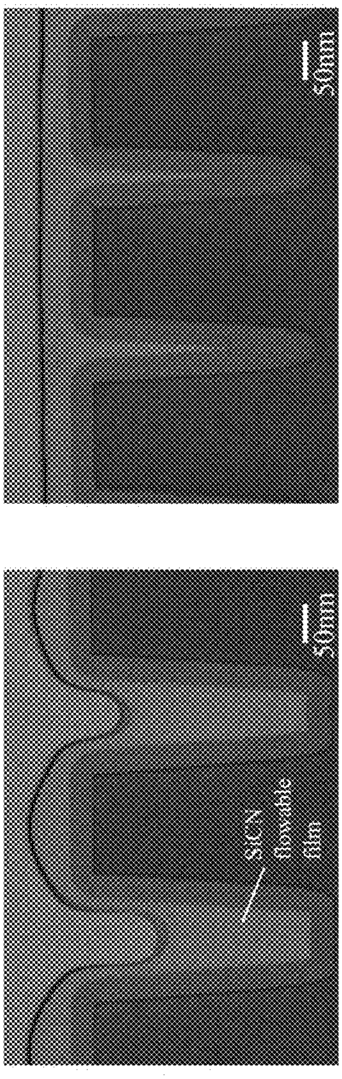
FIGS. 14A-14B illustrate example SiCN flowable films deposited according to some embodiments herein.
Figure 14B:
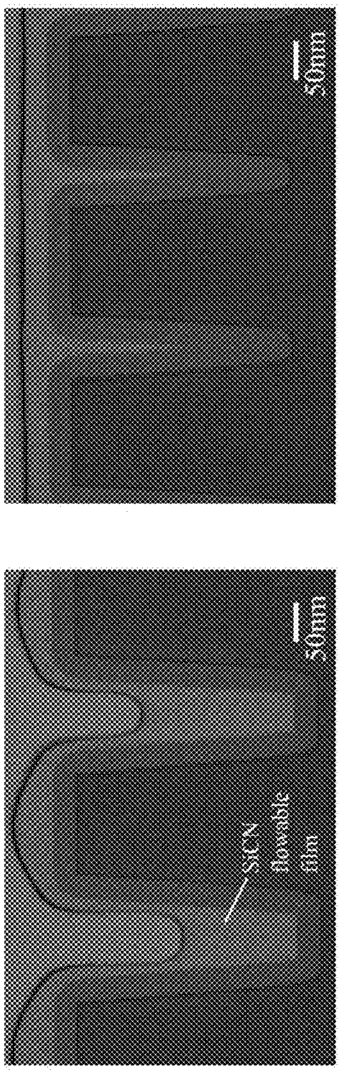

As shown in FIGS. 14A-14B, a SiCN film made using hexamethyldisilazane as a precursor according to some embodiments herein can result in a high quality film with few or no voids or seams. FIG. 14A shows that a high quality SiCN film can be formed during a deposition process that uses a cyclic thermal-UV curve at 130° C. (above the boiling point of the precursor). FIG. 14B shows that a high quality SiCN film can be formed during a flowable deposition process that uses a cyclic thermal-UV cure at 150° C. (above the boiling point of the precursor. In some embodiments, a flowable deposition using hexamethyldisilazane precursor material that employs a cyclic thermal-UV curve may produce a high quality film at cyclic cure temperatures at least as low as 100° C. In some cases, a WERR of about 2 may be obtained and the SiCN film may not shrink appreciably during a high temperature curing process (e.g., about 400° C. for about 30 minutes). In some embodiments, if a single post-deposition UV cure is used, the WERR may be higher than if a cyclic cure was used, for example about 3 or about 4, and the SiCN film may shrink significantly during a high temperature curing process, for example by about 2%, about 3%, or even more. However, even a single thermal-UV cure post-deposition can improve the film quality over as-deposited hexamethyldisilazane. For example, an as-deposited SiCN film made using hexamethyldisilazane as a precursor may have a WERR of more than 20 and may shrink by about 80% or more during a high temperature annealing step.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in various ways. All possible combinations and sub-combinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A method for flowable gap-fill deposition, the method comprising:

(a) placing a substrate having a gap in a first station;

(b) depositing a flowable material on the substrate in the first station by a vapor deposition process at a first temperature, wherein the flowable material is formed by 1,1,3,3-tetramethyl-1,3-divinyldisilazane or 1,3-divinyl-1,1,3,3-tetramethyldisilazane;

(c) placing the substrate in a second station;

(d) performing a thermal and ultraviolet treatment on the substrate by heating a surface of the substrate to a second temperature in the second station and exposing the substrate to ultraviolet light emitted by an ultraviolet light source; and repeating (a)-(d) in a cycle until a film of desired thickness is deposited within the gap on the substrate.

2. The method of claim 1, wherein the first temperature is less than 300° C.

3. The method of claim 1, wherein the second temperature is between 80° C. and 1000° C.

4. The method of claim 1, wherein the ultraviolet light has a wavelength between 100 nm and 230 nm.

5. The method of claim 4, wherein the ultraviolet light is provided by an excimer lamp.

6. The method of claim 5, wherein an excimer molecule is one of NeF, $Ar_2$, $Kr_2$, $F_2$, ArBr, $Xe_2$, ArCl, Krl, KrBr, KrCl, or ArF.

7. The method of claim 1, wherein the ultraviolet light source is a low pressure mercury lamp.

8. The method of claim 1, wherein the first station comprises an upper chamber and a lower chamber, and wherein the lower chamber comprises a shared intermediate space between the first station and the second station.

9. The method of claim 1, wherein the first station and the second station comprise a shared pressure system such that the first station and the second station are maintained at a common pressure during the cycle.

10. The method of claim 9, wherein the common pressure during the cycle is between 300 Pa and 2800 Pa.

11. The method of claim 1, wherein the first station comprises a first station heating unit configured to control a temperature of the first station independently of a temperature of the second station, and wherein the second station comprises a second station heating unit configured to control the temperature of the second station independently of the first station.

12. The method of claim 1, wherein the film comprises a SiCN film.

13. The method of claim 1, wherein the film fills at least 90% of the gap on the surface of the substrate, at least 95% of the gap on the surface of the substrate, at least 99% of the gap on the surface of the substrate, or at least 99.5% of the gap on the surface of the substrate.

14. The method of claim 1, wherein the substrate comprises silicon or germanium.

15. The method of claim 1, further comprising introducing one or more process gasses into the first station during contacting the substrate in the first station, wherein the process gasses comprise Ar, He, N2, H2, NH3, O2, or a combination of one or more of the above.

16. The method of claim 1, further comprising plasma curing the substrate after step (b) or (d), wherein the plasma curing comprises micro-pulsing radio frequency plasma into the first station or the second station.

17. The method of claim 16, wherein substrate is plasma cured in the second station after the thermal and ultraviolet treatment is performed on the substrate.

18. The method of claim 1, further comprising, after a film of desired thickness is deposited on the substrate:

transferring the substrate to an annealing chamber; and annealing the substrate at a third temperature, wherein the third temperature is higher than the first temperature and the second temperature.

19. The method of claim 1, wherein the thermal and ultraviolet treatment is performed for every 1 nm to 5 nm of deposited film thickness or for every 5 nm to 100 nm of deposited film thickness.

20. The method of claim 1, wherein the ultraviolet treatment comprises a vacuum ultraviolet (VUV) treatment.

21. A method for flowable gap-fill deposition, the method comprising:

(a) placing a substrate in a first station of a plurality of stations comprising the first station, a second station, a third station, and a fourth station, the first station comprising an upper chamber and a lower chamber, wherein the lower chamber comprises a shared intermediate space between the plurality of stations;

(b) contacting the substrate in the first station with a precursor at a first temperature, wherein the precursor is 1,1,3,3-tetramethyl-1,3-divinyldisilazane or 1,3-divinyl-1,1,3,3-tetramethyldisilazane, wherein contacting with the precursor forms a first flowable film layer within a gap of the substrate;

(c) after contacting the substrate in the first station with the precursor, placing the substrate in the second station;

(d) performing a first thermal and ultraviolet treatment on the substrate by heating the substrate to a second temperature in the second station and exposing the substrate to ultraviolet light;

(e) after performing the first thermal and ultraviolet treatment on the substrate, placing the substrate in the third station;

(f) contacting the substrate in the third station with the precursor at the first temperature, wherein contacting with the precursor forms a second flowable film layer within the gap;

(g) after contacting the substrate in the third station with the precursor, placing the substrate in the fourth station;

(h) performing a second thermal and ultraviolet treatment on the substrate by heating the substrate to the second temperature in the fourth station and exposing the substrate to ultraviolet light; and repeating (a)-(h) in a cycle until a film of desired thickness is deposited on the substrate, wherein the second temperature is different from the first temperature.

* * * * *